United States Patent
Yamazaki et al.

(10) Patent No.: US 8,734,915 B2
(45) Date of Patent: *May 27, 2014

(54) FILM-FORMATION METHOD AND MANUFACTURING METHOD OF LIGHT-EMITTING DEVICE

(75) Inventors: Shunpei Yamazaki, Tokyo (JP); Takahiro Ibe, Kanagawa (JP); Takuya Tsurume, Kanagawa (JP); Koichiro Tanaka, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 927 days.

This patent is subject to a terminal disclaimer.

(21) Appl. No.: 12/391,840

(22) Filed: Feb. 24, 2009

(65) Prior Publication Data

US 2009/0220706 A1  Sep. 3, 2009

(30) Foreign Application Priority Data

Feb. 29, 2008  (JP) ................................. 2008-049971

(51) Int. Cl.
  *B05D 3/06*  (2006.01)
  *B05D 5/12*  (2006.01)
  *C23C 14/32*  (2006.01)
  *C23C 14/28*  (2006.01)

(52) U.S. Cl.
  USPC ............. 427/596; 427/561; 427/586; 427/75; 427/69; 427/70

(58) Field of Classification Search
  None
  See application file for complete search history.

(56) References Cited

U.S. PATENT DOCUMENTS

| 4,743,463 A | * | 5/1988 | Ronn et al. ..................... 427/597 |
| 5,851,709 A | | 12/1998 | Grande et al. |
| 5,937,272 A | | 8/1999 | Tang |

(Continued)

FOREIGN PATENT DOCUMENTS

| DE | 2113336 | * | 9/1971 |
| EP | 0 913 870 A2 | | 5/1999 |

(Continued)

OTHER PUBLICATIONS

Tolbert et al., "Laser Oblation Transfer Imaging Using Picosecond Optical Pulses: Ultra-High Speed, Lower Threshold and High Resolution", Journal of Imaging Science & Technology, vol. 37, No. 5, Sep./Oct. 1993, pp. 485-489.*

(Continued)

*Primary Examiner* — Marianne L Padgett
(74) *Attorney, Agent, or Firm* — Husch Blackwell LLP

(57) ABSTRACT

A film-formation method whereby a minute pattern thin film can be formed on a deposition substrate, without provision of a mask between a material and the deposition substrate. Moreover, a light-emitting element is formed by such a film-formation method, and a high-definition light-emitting device can be manufactured. Through a film-formation substrate in which a reflective layer, a light-absorbing layer and a material layer are formed, the light-absorbing layer is irradiated with light, so that a material contained in the material layer is deposited on a deposition substrate which is disposed to face the film-formation substrate. Since the reflective layer is selectively formed, a film to be deposited on the deposition substrate can be selectively formed with a minute pattern reflecting the pattern of the reflective layer. A wet process can be employed for formation of the material layer.

14 Claims, 17 Drawing Sheets

(56) References Cited

U.S. PATENT DOCUMENTS

| | | | |
|---|---|---|---|
| 5,994,028 A * | 11/1999 | Lee | 430/273.1 |
| 6,165,543 A | 12/2000 | Otsuki et al. | |
| 6,283,060 B1 | 9/2001 | Yamazaki et al. | |
| 6,555,284 B1 | 4/2003 | Boroson et al. | |
| 6,566,032 B1 | 5/2003 | Boroson et al. | |
| 6,582,875 B1 * | 6/2003 | Kay et al. | 430/200 |
| 6,610,455 B1 | 8/2003 | Burberry et al. | |
| 6,649,320 B2 | 11/2003 | Kawase | |
| 6,682,863 B2 * | 1/2004 | Rivers et al. | 430/22 |
| 6,689,492 B1 | 2/2004 | Yamazaki et al. | |
| 6,695,029 B2 | 2/2004 | Phillips et al. | |
| 6,703,179 B2 | 3/2004 | Tyan | |
| 6,776,847 B2 | 8/2004 | Yamazaki et al. | |
| 6,776,880 B1 | 8/2004 | Yamazaki | |
| 6,797,920 B2 | 9/2004 | Kitaguchi et al. | |
| 6,811,938 B2 | 11/2004 | Tutt et al. | |
| 6,929,048 B2 * | 8/2005 | Phillips | 156/540 |
| 6,939,660 B2 | 9/2005 | Tutt et al. | |
| 7,015,154 B2 | 3/2006 | Yamazaki et al. | |
| 7,179,756 B2 | 2/2007 | Yamazaki et al. | |
| 7,265,489 B2 | 9/2007 | Yamasaki et al. | |
| 7,288,420 B1 | 10/2007 | Yamazaki et al. | |
| 7,291,365 B2 | 11/2007 | Kay et al. | |
| 7,316,983 B2 | 1/2008 | Yamazaki et al. | |
| 7,378,711 B2 | 5/2008 | Suh et al. | |
| 7,485,337 B2 | 2/2009 | Nguyen et al. | |
| 7,919,340 B2 * | 4/2011 | Ikeda et al. | 438/29 |
| 7,932,112 B2 * | 4/2011 | Yokoyama et al. | 438/34 |
| 7,993,945 B2 * | 8/2011 | Ikeda et al. | 438/29 |
| 8,080,811 B2 | 12/2011 | Yokoyama et al. | |
| 8,119,204 B2 * | 2/2012 | Ikeda et al. | 427/385.5 |
| 8,148,259 B2 * | 4/2012 | Arai et al. | 438/637 |
| 8,153,201 B2 * | 4/2012 | Aoyama et al. | 427/407.1 |
| 8,232,038 B2 * | 7/2012 | Hirakata et al. | 430/201 |
| 8,277,871 B2 * | 10/2012 | Aoyama et al. | 427/64 |
| 8,293,319 B2 * | 10/2012 | Ikeda et al. | 427/66 |
| 8,405,909 B2 * | 3/2013 | Tanaka | 359/618 |
| 8,425,974 B2 * | 4/2013 | Takahashi et al. | 427/66 |
| 8,431,432 B2 * | 4/2013 | Ikeda et al. | 438/99 |
| 8,435,811 B2 * | 5/2013 | Yokoyama et al. | 438/29 |
| 8,574,709 B2 * | 11/2013 | Seo et al. | 428/216 |
| 8,581,234 B2 * | 11/2013 | Yamazaki et al. | 257/29 |
| 2001/0006827 A1 | 7/2001 | Yamazaki et al. | |
| 2002/0197393 A1 | 12/2002 | Kuwabara | |
| 2002/0197401 A1 * | 12/2002 | Auyeung et al. | 427/248.1 |
| 2004/0056266 A1 | 3/2004 | Suh et al. | |
| 2004/0065902 A1 | 4/2004 | Yamazaki et al. | |
| 2004/0191564 A1 | 9/2004 | Kim et al. | |
| 2004/0206307 A1 | 10/2004 | Boroson et al. | |
| 2004/0217695 A1 | 11/2004 | Yoneda et al. | |
| 2005/0005848 A1 | 1/2005 | Yamazaki et al. | |
| 2005/0048295 A1 * | 3/2005 | Kim et al. | 428/447 |
| 2005/0145326 A1 | 7/2005 | Hatwar | |
| 2005/0157157 A1 | 7/2005 | Tsukamoto et al. | |
| 2005/0189883 A1 | 9/2005 | Suh et al. | |
| 2006/0084006 A1 | 4/2006 | Kang et al. | |
| 2006/0243377 A1 | 11/2006 | Matsuo et al. | |
| 2006/0246240 A1 | 11/2006 | Matsuda et al. | |
| 2006/0246693 A1 | 11/2006 | Tanaka et al. | |
| 2008/0050851 A1 | 2/2008 | Tanaka et al. | |
| 2008/0050895 A1 | 2/2008 | Miyairi et al. | |
| 2008/0057632 A1 | 3/2008 | Arai et al. | |
| 2008/0081115 A1 | 4/2008 | Yamazaki et al. | |
| 2008/0113292 A1 * | 5/2008 | Matsuo | 430/270.1 |
| 2008/0124850 A1 | 5/2008 | Takayama et al. | |
| 2008/0182349 A1 | 7/2008 | Yamazaki et al. | |
| 2008/0227232 A1 | 9/2008 | Yamazaki et al. | |
| 2008/0233272 A1 | 9/2008 | Ibe et al. | |
| 2008/0260938 A1 | 10/2008 | Ikeda et al. | |
| 2008/0268135 A1 | 10/2008 | Yokoyama et al. | |
| 2008/0268137 A1 | 10/2008 | Ikeda et al. | |
| 2008/0268561 A1 | 10/2008 | Ikeda et al. | |
| 2008/0299496 A1 | 12/2008 | Hirakata et al. | |
| 2008/0305287 A1 | 12/2008 | Ohata et al. | |
| 2009/0011677 A1 | 1/2009 | Ikeda et al. | |
| 2009/0075214 A1 | 3/2009 | Hirakata et al. | |
| 2009/0104403 A1 * | 4/2009 | Aoyama et al. | 428/136 |
| 2009/0104721 A1 | 4/2009 | Hirakata et al. | |
| 2009/0104835 A1 * | 4/2009 | Aoyama et al. | 445/58 |
| 2009/0142510 A1 | 6/2009 | Takahashi et al. | |
| 2009/0169809 A1 * | 7/2009 | Yokoyama et al. | 428/138 |
| 2009/0197017 A1 * | 8/2009 | Tanaka et al. | 427/596 |
| 2009/0221107 A1 * | 9/2009 | Yamazaki et al. | 438/29 |
| 2009/0226631 A1 | 9/2009 | Yamazaki et al. | |
| 2009/0233006 A1 | 9/2009 | Yamazaki et al. | |
| 2009/0258167 A1 * | 10/2009 | Tanaka | 427/595 |
| 2009/0269485 A1 * | 10/2009 | Ikeda et al. | 427/66 |
| 2009/0279179 A1 * | 11/2009 | Tanaka | 359/619 |
| 2010/0015424 A1 * | 1/2010 | Seo et al. | 428/216 |
| 2012/0251772 A1 * | 10/2012 | Aoyama et al. | 428/138 |

FOREIGN PATENT DOCUMENTS

| | | |
|---|---|---|
| EP | 1 176 642 A2 | 1/2002 |
| EP | 1 321 303 A1 | 6/2003 |
| EP | 1 335 637 A1 | 8/2003 |
| EP | 1 347 670 A1 | 9/2003 |
| JP | 11-237504 | 8/1999 |
| JP | 2000-256877 | 9/2000 |
| JP | 2001-52864 | 2/2001 |
| JP | 2001-102170 | 4/2001 |
| JP | 2002-190386 | 7/2002 |
| JP | 2002-240437 | 8/2002 |
| JP | 2002-359075 | 12/2002 |
| JP | 2003-197372 | 7/2003 |
| JP | 2004-103406 | 4/2004 |
| JP | 2004-281189 | 10/2004 |
| JP | 2006-113568 | 4/2006 |
| JP | 2006-202510 | 8/2006 |
| JP | 2006-228649 | 8/2006 |
| JP | 2006-244944 | 9/2006 |
| JP | 2006-309995 | 11/2006 |
| JP | 2007-141702 | 6/2007 |
| JP | 2008-500699 | 1/2008 |
| JP | 2008-66147 | 3/2008 |
| JP | 2008-147016 | 6/2008 |
| WO | WO 2005/119810 A2 | 12/2005 |

OTHER PUBLICATIONS

Yoshiki Nakata et al., "laser-induced forward transfer: the effect of polls with and target substrate distance", Technical Digest, conference on lasers and electro-optics (CLEO '89), May 3-8, 1998, 1998 OSA Technical Digest Series, vol. 6, p. 150.*

Urabe, T. et al, "13.1: Invited Paper: Technological Evolution for Large Screen Size Active Matrix OLED Display," SID '07 Digest: SID International Symposium Digest of Technical Papers, vol. 38, 2007, pp. 161-164.

English abstract of JP 2006-202615 A1 by Murakami Satoshi et al., published Sep. 14, 2006.

Luther-Davies et al., "Picosecond high-repetition-rate pulsed laser ablation of dielectrics: the effect of energy accumulation between pulses", Optical Engineering, May 2005, vol. 44, No. 5, pp. 051102-1 thru 051102-8.

English abstract of US 2006-202615 A1 by Murakami Satoshi et al., published Sep. 14, 2006.

* cited by examiner 711  712  714  713

FILM-FORMATION METHOD AND MANUFACTURING METHOD OF LIGHT-EMITTING DEVICE

BACKGROUND OF THE INVENTION

1. Field of the Invention

The present invention relates to a film-formation method and a method for manufacturing a light-emitting device.

2. Description of the Related Art

In a light-emitting device provided with an electroluminescent (hereinafter also referred to as EL) element, color light-emitting elements which emit color light is used in order to perform full-color display. In forming a color light-emitting element, it is necessary to form a light-emitting material of each color in a minute pattern on an electrode.

In general, a method is used in which a mask is provided between an evaporation material and a deposition substrate, and a film with a minute pattern is formed, in a case where a material is deposited by a method such as an evaporation method.

However, as a result of miniaturization of a pixel region associated with improvement in definition and increase in size of a deposition substrate associated with increase in device size, defects due to precision of a mask used at the time of evaporation or sag thereof have become issues. For solving the issues, there is a reported study in which a spacer for supporting a mask is provided over a pixel electrode layer to prevent defective deposition caused by deformation or sag of the mask (see for example, reference 1: Japanese Published Patent Application No 2006-113568).

SUMMARY OF THE INVENTION

It is an object of the present invention to provide a method for forming a thin film having a minute pattern on a deposition substrate, without providing a mask having such issues between an evaporation material and a deposition substrate. Further, it is another object of the present invention to form a light-emitting element by the method and to manufacture a high-definition light-emitting device.

According to the present invention, a film-formation substrate in which a reflective layer, a light-absorbing layer and a material layer are formed over a substrate is irradiated with laser light, the laser light is transmitted through the substrate, and the light-absorbing layer is irradiated with the laser light, so that a material contained in the material layer is deposited on a deposition substrate which is disposed to face the film-formation substrate. Since the reflective layer is selectively formed, a film to be deposited on the deposition substrate can be selectively formed with a minute pattern reflecting the pattern of the reflective layer. A wet process can be employed for formation of the material layer.

In this specification, a substrate on which a thin film with a minute pattern is to be formed is referred to as a deposition substrate, while a substrate which donates a material to be deposited on the deposition substrate is referred to as a film-formation substrate.

An embodiment of a film-formation method of the present invention includes: forming a reflective layer having an opening portion over a first substrate; forming a light-absorbing layer over the reflective layer; forming, over the light-absorbing layer, a material layer using a liquid composition containing a material by a wet process, and thereby a film-formation substrate is formed; disposing the film-formation substrate and a deposition substrate such that a formation surface of the material layer of the film-formation substrate faces a deposition surface of the deposition substrate; irradiating the light-absorbing layer with laser light through the first substrate and the opening portions of the reflective layer; and depositing the material contained in the material layer formed over the light-absorbing layer which has been irradiated with the laser light, on the deposition substrate.

An embodiment of a film-formation method of the present invention includes: forming a reflective layer having an opening portion over a first substrate; forming a light-absorbing layer over the reflective layer; forming, over the light-absorbing layer, a material layer using a liquid composition containing a material by a wet process, and thereby a film-formation substrate is formed; disposing a deposition substrate above the film-formation substrate such that a formation surface of the material layer of the film-formation substrate faces a deposition surface of the deposition substrate; irradiating the light-absorbing layer with laser light through the first substrate and the opening portions of the reflective layer; and depositing the material contained in the material layer over the light-absorbing layer which has been irradiated with the laser light, on the deposition substrate.

An embodiment of a film-formation method of the present invention includes: forming a reflective layer having an opening portion over a first substrate; forming a heat-insulating layer having a light-transmitting property over the reflective layer; forming a light-absorbing layer over the heat-insulating layer; forming, over the light-absorbing layer, a material layer using a liquid composition containing a material by a wet process, and thereby a film-formation substrate is formed; disposing the film-formation substrate and a deposition substrate such that a formation surface of the material layer of the film-formation substrate faces a deposition surface of the deposition substrate; irradiating the light-absorbing layer with laser light through the first substrate, the opening portions of the reflective layer, and the heat-insulating layer; and depositing the material contained in the material layer formed over the light-absorbing layer which has been irradiated with the laser light, on the deposition substrate.

According to the present invention, a minute pattern thin film can be deposited on a deposition substrate without providing a mask between an evaporation material and the deposition substrate.

An embodiment of a film-formation method of the present invention includes: forming a reflective layer having an opening portion over a first substrate; forming a heat-insulating layer having a light-transmitting property over the reflective layer; forming a light-absorbing layer over the heat-insulating layer; forming, over the light-absorbing layer, a material layer using a liquid composition containing a material by a wet process, and thereby a film-formation substrate is formed; disposing a deposition substrate above the film-formation substrate such that a formation surface of the material layer of the film-formation substrate faces a deposition surface of the deposition substrate; irradiating the light-absorbing layer with laser light through the first substrate, the opening portions of the reflective layer, and the heat-insulating layer; and depositing the material contained in the material layer formed over the light-absorbing layer which has been irradiated with the laser light, on the deposition substrate.

In the above-described structures of the present invention, it is possible that the material layer is formed over the film-formation substrate by a wet process, and a material contained in the material layer can be deposited on the deposition substrate disposed above, by irradiation with light from the bottom side of the film-formation substrate. Thus, the film-formation substrate can be disposed during the deposition process such that the material layer side faces up (so-called face up installation). Since the film-formation substrate is not disposed such that the material layer side faces down (so-called face down installation), the material layer can be prevented from being contaminated due to dust or the like during the deposition process. In this case, the term "down" means a direction in which an object freely falls.

The material layer formed over the film-formation substrate by a wet process may be subjected to heating. The heating makes it possible to remove a solvent contained in the material layer or planarize the material layer, which leads to improvement in quality of the material layer.

Irradiation of the light-absorbing layer with laser light is preferably conducted under a reduced pressure. When laser irradiation is conducted under a reduced pressure and a material is deposited on the deposition substrate, influence of contaminants such as dust to a film to be formed can be reduced.

The wet process can be an application method typified by a spin coating method, an inkjet method or the like. Further, since the wet process can be used at atmospheric pressure, facilities such as a vacuum apparatus and equipment used therefor can be reduced. Furthermore, since the size of a substrate that is to be processed is not limited by the size of a vacuum chamber, a larger substrate can be treated and a processed region is increased, whereby low cost and an improvement of productivity can be achieved.

As laser light, laser light having a repetition rate of 10 MHz or higher and a pulse width of from 100 fs to 10 ns can be used. Laser light having a very small pulse width as described above is used, so that thermal conversion in the light-absorbing layer is efficiently conducted and the material can be efficiently heated. Since the laser light whose repetition rate is 10 MHz or higher and pulse width is from 100 fs to 10 ns is capable of short-time irradiation, diffusion of heat can be suppressed, and thus a minute pattern film can be deposited. In addition, since the laser light whose repetition rate is 10 MHz or higher and pulse width is from 100 fs to 10 ns is capable of high output, a large area can be processed at a time. Further, laser light is shaped into a linear or rectangular shape on an irradiation plane, and thereby the laser light can scan a process substrate efficiently. Thus, time taken for deposition (takt time) can be shortened. Accordingly, productivity can be increased.

The heat-insulating layer is preferably formed using a material whose transmittance to laser light is 60% or higher and thermal conductivity is smaller than materials used for the reflective layer and the light-absorbing layer. Due to low thermal conductivity, heat obtained from laser light can be efficiently used for deposition.

The material layer is formed using a liquid composition including an organic compound, and is deposited on a first electrode provided for a deposition surface of the deposition substrate, so that a light-emitting element can be formed. An EL layer having a minute pattern can be formed on the deposition substrate, and an EL layer can be separately formed for each emission color. A high-definition light-emitting device having such light-emitting elements can be manufactured.

According to the present invention, a thin film can be formed over a large area deposition substrate, and thus a large size light-emitting device and a large size electronic device can be manufactured.

In the present invention, a minute pattern thin film can be formed over a deposition substrate, without provision of a mask between an evaporation material and a deposition substrate. Moreover, a light-emitting element is formed by such a film-formation method as described above, and a high-definition light-emitting device can be manufactured. In addition, since a thin film can be formed over a large area deposition substrate according to the present invention, a large size light-emitting device and a large size electronic device can be manufactured.

DETAILED DESCRIPTION OF THE INVENTION

Figure 1A:
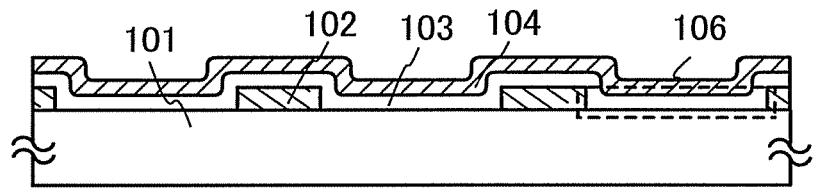
FIGS. 1A to 1E are cross-sectional views of a film-formation method according to an embodiment of the present invention.

Embodiments of the present invention will be described below with reference to the drawings. However, the present invention may be embodied in a lot of different modes, and it is to be easily understood that various changes and modifications will be apparent to those skilled in the art unless such changes and modifications depart from the spirit and scope of the present invention. Therefore, the present invention is not to be construed as being limited to description made in embodiments. Through the drawings for illustrating embodiments, like components are denoted by like reference numerals and repetitive description thereof is not made.

Embodiment 1

In Embodiment 1, an example of a film-formation method by which a thin film having a minute pattern is deposited on a deposition substrate according to the present invention will be described with reference to FIGS. 1A to 1E, FIGS. 2A to 2C, FIGS. 3A to 3D and FIGS. 4A to 4D.

FIG. 1A illustrates an example of a film-formation substrate. A reflective layer 102 is selectively formed over a first substrate 101, a heat-insulating layer 103 is formed over the reflective layer 102, and a light-absorbing layer 104 is formed over the heat-insulating layer 103. The reflective layer 102 has an opening portion 106, and the heat-insulating layer 103 and the light-absorbing layer 104 are entirely formed over the first substrate 101 in FIG. 1A.

In the present invention, the light-absorbing layer 104 formed over the film-formation substrate is irradiated with light from the first substrate 101 side for deposition. Accordingly, the first substrate 101, the reflective layer 102, the heat-insulating layer 103, and the light-absorbing layer 104 should have a light-transmitting property, a reflective property, a light-transmitting property and a light-absorbing property, respectively, with respect to light used for irradiation. Therefore, the kinds of materials appropriate for the first substrate 101, the reflective layer 102, the heat-insulating layer 103, and the light-absorbing layer 104 varies depending on the wavelength of irradiation light, and thus materials thereof should be selected suitably.

In addition, the first substrate 101 is preferably a material having low thermal conductivity. Due to low thermal conductivity, heat obtained from irradiation light can be efficiently utilized for deposition. As the first substrate 101, for example, a glass substrate, a quartz substrate, a plastic substrate containing an inorganic material, or the like can be used. As the glass substrate, various glass substrates used for electronic industry called non-alkali glass such as aluminosilicate glass, aluminoborosilicate glass, or barium borosilicate glass can be used.

The reflective layer 102 is a layer for partially reflecting irradiation light striking the other part than a part of the light-absorbing layer 104, so that the part of the light-absorbing layer 104 is selectively irradiated with light during deposition. Therefore, the reflective layer 102 is preferably formed using a material having high reflectance to the irradiation light. Specifically, the reflective layer 102 preferably has a reflectance of 85% or higher, more preferably, a reflectance of 90% or higher of the irradiation light.

As a material for the reflective layer 102, for example, silver, gold, platinum, copper, an alloy containing aluminum, an alloy containing silver, indium tin oxide, or the like can be used.

The thickness of the reflective layer 102 is preferably about 100 nm or thicker although it depends on a material or irradiation light. With a thickness of 100 nm or thicker, the irradiation light can be prevented from passing through the reflective layer.

The opening portion 106 can be formed in the reflective layer 102 by any of a variety of methods but is preferably formed by dry etching. By dry etching, the opening portion 106 has steeper side faces and a minute pattern can be formed.

The heat-insulating layer 103 is a layer for preventing heat from being transferred to the light-absorbing layer 104 and the material layer 105, which are formed later, if light reflected on the reflective layer 102, of the irradiation light during deposition partially remains as heat in the reflective layer. Thus, the heat-insulating layer 103 should be formed using a material which has lower thermal conductivity than materials forming the reflective layer 102 and the light-absorbing layer 104. In addition, as illustrated in FIGS. 1A to 1E, in the case where light passes through the opening portion 106 of the reflective layer 102, and then the heat-insulating layer 103 such that the light-absorbing layer is irradiated with the light, the heat-insulating layer 103 should have a light-transmitting property. In this case, the heat-insulating layer 103 of the present invention should be formed using a material which has high light transmittance as well as low thermal conductivity. Specifically, the heat-insulating layer 103 is preferably formed using a material which has a transmittance of 60% or more of light.

A material for the heat-insulating layer 103 can be, for example, titanium oxide, silicon oxide, silicon nitride oxide, zirconium oxide, or silicon carbide.

The thickness of the heat-insulating layer 103 is preferably from about 10 nm to 2 μm although it depends on a material. The thickness of the heat-insulating layer 103 is more preferably from 100 μm to 600 μm. With a thickness of from 10 μm to 2 μm, the heat-insulating layer 103 can transmit the irradiation light which have passed through the opening portion 106 of the reflective layer 102 as well as block heat transfer in the reflective layer 102 to the light-absorbing layer 104 and the material layer 105. Note that while the heat-insulating layer 103 is formed to cover the reflective layer 102 and the opening portion 106 of the reflective layer 102 in FIGS. 1A to 1E, the heat-insulating layer 103 may be formed only at a position overlapping with the reflective layer 102.

The light-absorbing layer 104 absorbs light which is used for deposition. Therefore, the light-absorbing layer 104 is preferably formed using a material which has low reflectance and high absorptance of the irradiation light. Specifically, the light-absorbing layer 104 preferably has a reflectance of 70% or less of the irradiation light.

Various kinds of materials can be used for the light-absorbing layer 104. For example, metal nitride such as titanium nitride, tantalum nitride, molybdenum nitride, or tungsten nitride; metal such as titanium, molybdenum, or tungsten; carbon; or the like can be used. Since a kind of material that is suitable for the light-absorbing layer 104 varies depending on the wavelength of the irradiation light, the material of the light-absorbing layer 104 should be selected as appropriate. Note that the light-absorbing layer 104 is not limited to a single layer and may include a plurality of layers. For example, a stack structure of a metal and a metal nitride may be employed.

The reflective layer 102, the heat-insulating layer 103 and the light-absorbing layer 104 can be formed by any of different kinds of methods. For example, a sputtering method, an electron beam evaporation method, a vacuum evaporation method, a chemical vapor deposition (CVD) method or the like may be adopted.

The thickness of the light-absorbing layer 104 varies depending on a material or irradiation light, but is preferably such a thickness that cannot transmit the irradiation light. Specifically, the thickness is preferably from 10 nm to 2 μm. In addition, when the thickness of the light-absorbing layer is smaller, the smaller energy of laser light is used for deposition; therefore the thickness is preferably from 10 nm to 600 nm. For example, if light having a wavelength of 532 nm is used for irradiation, the thickness of the light-absorbing layer 104 is from 50 nm to 200 nm, and thereby the irradiation light can be efficiently absorbed so that heat is generated. In addition, the light-absorbing layer 104 having a thickness of from 50 nm to 200 nm allows highly accurate deposition onto the deposition substrate.

The light-absorbing layer 104 may transmit part of irradiation light as long as it can be heated up to a film-formation temperature of a material contained in the material layer 105 (to a temperature at which at least part of the material contained in the material layer is deposited on the deposition substrate). Note that when the light-absorbing layer 104 transmits part of the irradiation light, a material that is not decomposed by light should be used as the material contained in the material layer 105.

Moreover, it is preferable that the difference in reflectance between the reflective layer 102 and the light-absorbing layer 104 is greater. Specifically, the difference in reflectance of the wavelength of the irradiation light is preferably 25% or more, more preferably, 30% or more.

Figure 1B:
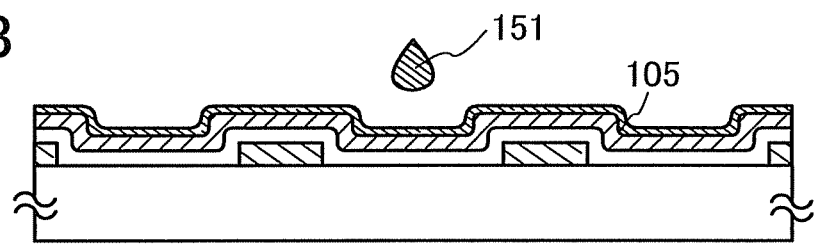

The material layer 105 containing a material to be deposited on the deposition substrate is formed over the light-absorbing layer 104 (FIG. 1B). In the present invention, the material layer 105 is formed by a wet process. In the wet process, a material that is to form a thin film is dissolved in a solvent, the liquid composition is attached to a region where the layer is to be formed, the solvent is removed, and the resulting material is solidified, whereby a thin film is formed. In this embodiment, a liquid composition 151 including the material is applied over the light-absorbing layer 104 and solidified to form the material layer 105.

The application of the composition may be conducted under reduced pressure. The substrate may be heated during the application of the composition. Solidification of the material layer 105 may be conducted by one or both of drying and baking, after application of the liquid composition. Both the drying and baking are heat treatments but different in purpose, temperature, and time period. The drying and baking are performed at normal pressure or under reduced pressure by laser irradiation, rapid thermal annealing, a heating furnace, or the like. Further, the timing of performing the heat treatment and the number of the heat treatments are not particularly limited. The conditions for favorable steps of drying and baking, such as temperature and time, depend on the material of the substrate and properties of the composition.

The material layer 105 contains the material which is to be deposited on the deposition substrate. Then, the film-formation substrate is irradiated with light so that the material contained in the material layer 105 is heated, and at least a part of the material contained in the material layer 105 is deposited on the deposition substrate. When the material layer 105 is heated, at least part of the material contained in the material layer is evaporated or at least part of the material layer is thermally deformed, and thereby stress change occurs so that a film is released and deposited on the deposition substrate.

For the wet process, any of the following methods can be employed: a spin coating method, a roll coat method, a spray method, a casting method, a dipping method, a droplet discharging (ejection) method (an inkjet method), a dispenser method, a variety of printing methods (a method by which a thin film can be formed in a desired pattern, such as screen (stencil) printing, offset (planographic) printing, letterpress printing, or gravure (intaglio) printing, or the like.

In the wet process, compared with a dry process such as an evaporation method or a sputtering method, a material is not scattered in a chamber, and therefore, efficiency in material use is higher. Furthermore, facilities such as a vacuum apparatus and equipment used therefor can be reduced because the wet process can be performed at atmospheric pressure. Furthermore, since the size of a substrate that is to be processed is not limited by the size of a vacuum chamber, a larger substrate can be treated and a processed region is increased, whereby low cost and an improvement of productivity can be achieved. A wet process requires only heat treatment at such temperatures that remove a solvent of a composition, and thus is a so-called low temperature process. Therefore, it is possible to use even substrates and materials that may be degraded or deteriorated by heat treatment at high temperature.

As the material contained in the material layer 105, a wide variety of kinds of materials that can be formed as a film by a wet process can be used, regardless of an organic compound or an inorganic compound. If an EL layer of a light-emitting element is formed, a material that can be formed as a film for an EL layer is used. For example, an organic compound which forms an EL layer, such as a light-emitting material or a carrier-transporting material; a material for a carrier-transporting layer or a carrier-injecting layer used for an EL layer; or an inorganic compound which is used for an electrode or the like of a light-emitting element, such as metal oxide, metal nitride, metal halide, or an elementary substance of metal can be used.

The material layer 105 may contain a plurality of materials. The material layer 105 may be a single layer or a stack of a plurality of layers.

As in the present invention, in order to form the material layer 105 by a wet process, a desired material may be dissolved or dispersed in a solvent, and a liquid composition (a solution or a dispersion) may be adjusted. There are no particular limitations on the solvent as long as it can dissolve or disperse a material and it does not react with the material. Examples of the solvent are as follows: halogen solvents such as chloroform, tetrachloromethane, dichloromethane, 1,2-dichloroethane, and chlorobenzene; ketone solvents such as acetone, methyl ethyl ketone, diethyl ketone, n-propyl methyl ketone, and cyclohexanone; aromatic solvents such as benzene, toluene, and xylene; ester solvents such as ethyl acetate, n-propyl acetate, n-butyl acetate, ethyl propionate, γ-butyrolactone, and diethyl carbonate; ether solvents such as tetrahydrofuran and dioxane; amide solvents such as dimethylformamide and dimethylacetamide; dimethyl sulfoxide; hexane; water; and the like. A mixture of plural kinds of these solvents may also be used.

Note that in the case where the thickness and uniformity of a film that is formed on the deposition substrate are controlled with the material layer 105, the thickness and uniformity of the material layer 105 should be controlled. However, the material layer 105 does not need to be a uniform layer if the thickness and uniformity of a film which is formed on the deposition substrate is not affected. For example, the material layer may be formed with a minute island shape or may be formed to a layer having concave and convex portions.

Figure 1C:
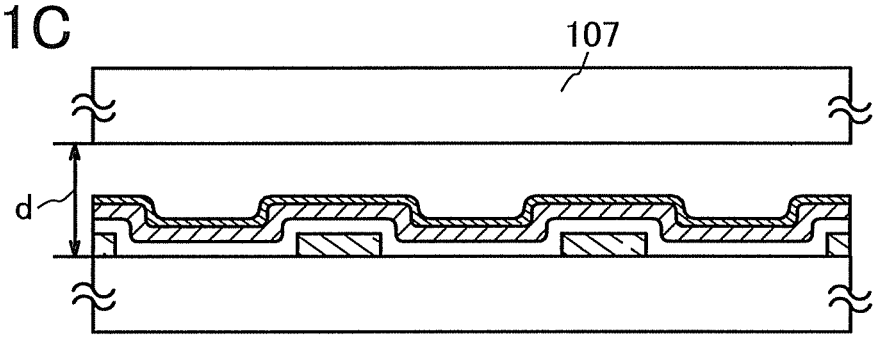

Then, a second substrate 107, which is a deposition substrate, is disposed at position facing a surface of the first substrate 101 which is provided with the reflective layer 102, the heat-insulating layer 103, the light-absorbing layer 104, and the material layer 105 (FIG. 1C). The second substrate 107 is the deposition substrate on which a desired layer is deposited by a film-formation process. Then, the first substrate 101 and the second substrate 107 are disposed so as to face each other in proximity; specifically, they are disposed close to each other so that the distance d between the surface of the first substrate 101 and the surface of the second substrate 107 is from 0 mm to 2 mm, preferably from 0 mm to 0.05 mm, or more preferably from 0 mm to 0.03 mm. If the first substrate 101 and the second substrate 107 are particularly large, an error may occur in the distance d between the substrates due to sag or warp of the substrates, and distribution of values of the distance d may be observed. In this case, the distance d is the shortest distance between the first substrate 101 and the second substrate 107. Depending on the size or arrangement of the substrates, the first substrate 101 and the second substrate 107 may be partially contacted with each other.

Figure 1D:
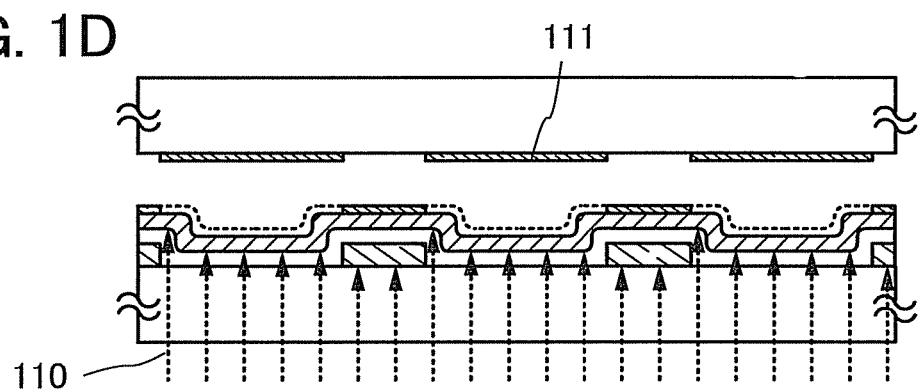
Figure 1E:
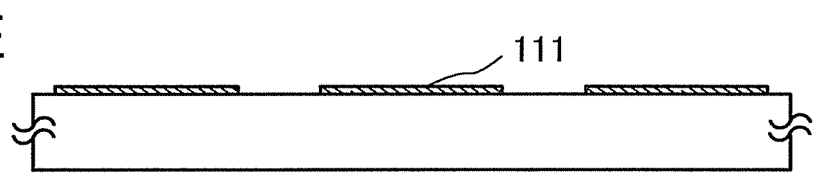

Then, a rear surface of the first substrate 101 (the surface on which the reflective layer 102, the heat-insulating layer 103, the light-absorbing layer 104, and the material layer 105 are not formed) is irradiated with light 110 (FIG. 1D). At this time, light 110 which is delivered to the reflective layer 102 over the first substrate 101 is reflected while light 110 which is delivered to the opening portion 106 of the reflective layer 102 passes through the opening portion 106 and the heat-insulating layer 103 to be absorbed by the light-absorbing layer 104. Then, the light-absorbing layer 104 gives the material contained in the material layer 105 heat obtained from absorbed light, and thereby at least part of the material contained in the material layer 105 is deposited as a film 111 on the second substrate 107. In this manner, the desired-patterned film 111 is formed over the second substrate 107 (FIG. 1E).

As the irradiation light 110, laser light can be used. In addition, there are not particular limitations on the wavelength of laser light, and laser light having a wide variety of wavelengths can be used. For example, laser light having a wavelength of 355 μm, 515 nm, 532 nm, 1030 nm, or 1064 nm can be used.

As the laser light, it is possible to use light oscillated from one or more of a gas laser such as an Ar laser, a Kr laser, or an excimer laser; or a solid-state laser such as a laser using, as a medium, single crystalline YAG, $YVO_4$, forsterite ($Mg_2SiO_4$), $YAlO_3$, or $GdVO_4$, or polycrystalline (ceramic) YAG, $Y_2O_3$, $YVO_4$, $YAlO_3$, or $GdVO_4$, to which one or more of Nd, Yb, Cr, Ti, Ho, Er, Tm, or Ta is added as a dopant, a glass laser, a ruby laser, an alexandrite laser, a Ti:sapphire laser, or a fiber laser. Alternatively, a second harmonic, a third harmonic, or higher harmonics oscillated from the above-described solid-state laser can be used. Note that, when a solid-state laser whose laser medium is solid is used, there are advantages that a maintenance-free condition can be maintained for a long time and output is relatively stable.

The shape of a laser spot is preferably linear or rectangular. By employing a linear shape or a rectangular shape, laser scanning on a treatment substrate can be efficiently conducted. Thus, the time for deposition (takt time) can be reduced and productivity can be increased. Further, the shape of the laser spot may be elliptic.

In the present invention, the material layer 105 is heated not with radiation heat of light emitted from a light source but with heat of the light-absorbing layer 104 which absorbs light emitted from a light source. Therefore, the irradiation time of light is preferably short, so that heat is not transferred from a part of the light-absorbing layer 104 which is irradiated with light to a part of the light-absorbing layer 104 which is not irradiated with light in a plane direction, and thereby enlargement of an area of the material layer 105 which is to be heated can be suppressed.

Deposition by light irradiation is preferably performed under a reduced-pressure atmosphere. Accordingly, the deposition chamber preferably have a pressure of $5\times10^{-3}$ Pa or less, more preferably from $10^{-6}$ Pa to $10^{-4}$ Pa.

As the irradiation light 110, laser light whose repetition rate is 10 MHz or higher and pulse width is from 100 fs to 10 ns is used. With use of such laser light whose pulse width is very small, thermal conversion in the light-absorbing layer 104 is efficiently performed, and thus the material can be efficiently heated.

Since the laser light whose repetition rate is 10 MHz or higher and pulse width is from 100 fs to 10 ns is capable of short-time irradiation, diffusion of heat can be suppressed, and thus a minute-patterned film can be deposited. In addition, since the laser light whose repetition rate is 10 MHz or higher and pulse width is from 100 fs to 10 ns is capable of high output, a large area can be processed at a time, and thus time taken for deposition can be shortened. Accordingly, productivity can be increased.

Figure 2A:
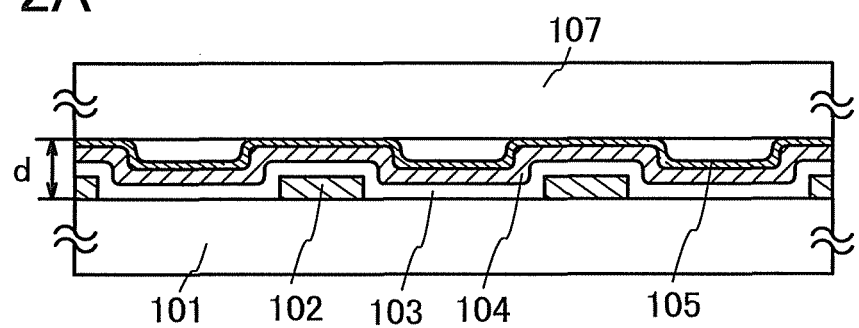
FIGS. 2A to 2C are cross-sectional views of a film-formation method according to an embodiment of the present invention.
Figure 2B:
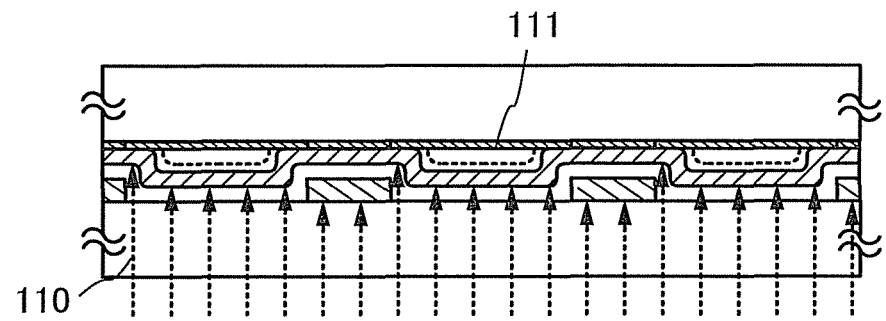
Figure 2C:
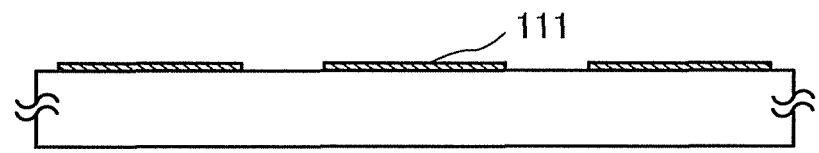

If the distance d which is the shortest distance between the first substrate 101 and the second substrate 107 is decreased, the outermost surface of the first substrate 101 and the outer surface of the second substrate 107 may be contacted with each other. FIGS. 2A to 2C illustrate an example in which the distance d is decreased.

As illustrated in FIG. 2A, the first substrate 101 and the second substrate 107 are disposed with a distance d short enough that the material layer 105 as the outermost surface of the first substrate 101 and the second substrate 107 can be contacted with each other. As described above, if the outer surface layers of the first substrate 101 and the second substrate 107 have uneven portions, the outer surface layers are partially contacted with each other and are not partially contacted with each other.

In FIG. 2B, similar to FIGS. 1A to 1E, the light-absorbing layer 104 is irradiated with the light 110 from the first substrate 101 side, heat obtained from absorbed light is given to the material layer 105, and thereby at least part of the material contained in the material layer 105 is formed as the film 111 over the second substrate 107. The film 111 is formed to a pattern reflecting the shape of the reflective layer 102 that is selectively provided for the second substrate 107 (FIG. 2C). By decreasing the distance d in this manner, in irradiation with light as illustrated in FIG. 2B, the shape of the film 111 which is deposited on the second substrate 107 can be formed with high accuracy.

In addition, if light transmitted through the opening portion of the reflective layer 102 spreads, the opening portion of the reflective layer 102 may be made smaller in consideration of the spread of the irradiation light.

In the present invention, it is possible that the material layer is formed over the film-formation substrate by a wet process, and a material contained in the material layer is deposited on the deposition substrate disposed above, by irradiation with light from the bottom side of the film-formation substrate. Thus, the film-formation substrate can be disposed during the deposition process such the material layer side faces up (so-called face up installation). Since the film-formation substrate is not disposed such that the material layer side faces down (so-called face down installation), the material layer can be prevented from being contaminated due to dust or the like during the deposition process. In this case, the term "down" means a direction in which an object freely falls.

If a full color display device is manufactured, light-emitting layers should be separately formed. In this case, light-emitting layers are formed by a film-formation method of the present invention, and thereby light-emitting layers having desired patterns can be separately formed with ease. In addition, the light-emitting layers can be separately formed with high accuracy.

According to the present invention, the thickness of the film which is deposited on the second substrate, which is the deposition substrate, can be controlled by controlling the thickness of the material layer formed over the first substrate. In other words, since the thickness of the material layer is controlled in advance so that a film to be deposited on the second substrate can have a desired thickness by depositing the whole material contained in the material layer formed over the first substrate, a thickness monitor is not needed in the deposited on the second substrate. Therefore, a user does not have to adjust the deposition rate with a thickness monitor, and the deposition process can be fully automated. Accordingly, productivity can be increased.

According to the present invention, the material contained in the material layer 105 formed over the first substrate can be deposited uniformly. In the case where the material layer 105 contains plural kinds of materials, a film containing the same evaporation materials at roughly the same weight ratio as those of the material layer 105 can be deposited onto the second substrate, which is the deposition substrate. Therefore, in a film-formation method according to the present invention, when deposition is performed using plural kinds of materials having different deposition temperatures, unlike co-evaporation, the deposition rate of each material does not have to be controlled. Thus, without complicated control of the deposition rate or the like, a desired layer containing different kinds of materials can be deposited easily with high accuracy.

Moreover, by a film-formation method of the present invention, a desired material can be deposited on the deposition substrate without being wasted. Thus, efficiency in material use is increased, and manufacturing cost can be reduced. Moreover, a material can be prevented from being attached to an inner wall of a deposition chamber, and thus maintenance of the film-formation apparatus can be facilitated.

According to the present invention, a film which is flat and has no unevenness can be formed. In addition, deposition at only a desired region is possible, and thus a minute-patterned film can be formed, which can lead to manufacture of a high-definition light-emitting device.

Further, since the application of the present invention enables selective deposition at a desired region at the time of deposition using laser light, efficiency in material use can be increased and formation of a film of a desired shape with high accuracy is easy; thus, productivity can be increased.
Embodiment 2

Figure 3A:
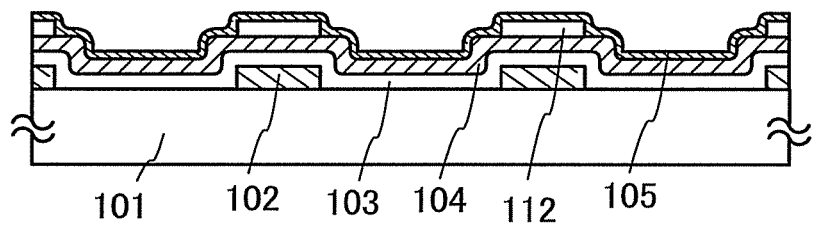
FIGS. 3A to 3D are cross-sectional views showing an example of a film-formation substrate according to an embodiment of the present invention.

In Embodiment 2, another example of a film-formation substrate that can be used for the present invention will be described with reference to FIGS. 3A to 3D and FIGS. 4A to 4D. FIG. 3A illustrates a structure in which a heat-insulating layer 112 which is a second heat-insulating layer is provided between a light-absorbing layer 104 and a material layer 105. The heat-insulating layer 112 is selectively formed in a region overlapping with the reflective layer 102. Even if heat in the light-absorbing layer 104 formed at a position overlapping with the opening portion 106 is transferred to the light-absorbing layer 104 formed at a position overlapping with the reflective layer 102 (heat is transferred in a plane direction of the light-absorbing layer 104) at the time of light irradiation for deposition, heat transfer to the material layer 105 can be prevented because the heat-insulating layer 112 is provided. Thus, deformation of a deposition pattern which occurs due to heating of the material layer 105 formed at a region overlapping with the reflective layer 102 can be prevented. In addition, provision of the heat-insulating layer 112 makes it possible to place a distance between the light-absorbing layer 104 which serves as a heat source and the deposition substrate; thus, a deposition defect due to heating of the second substrate 107 by heat from the light-absorbing layer 104 can be prevented. Furthermore, since the evaporation direction of a material which is to be deposited on the deposition substrate from the material layer 105 can be controlled, deformation of a deposition pattern on a deposition surface can be prevented.

Note that, although a material and a film-formation method used for the heat-insulating layer 112, which is the second heat-insulating layer, can be similar to those used for the heat-insulating layer 103, the transmittance of the material is not particularly limited unlike the case of the heat-insulating layer 103.

Figure 3B:
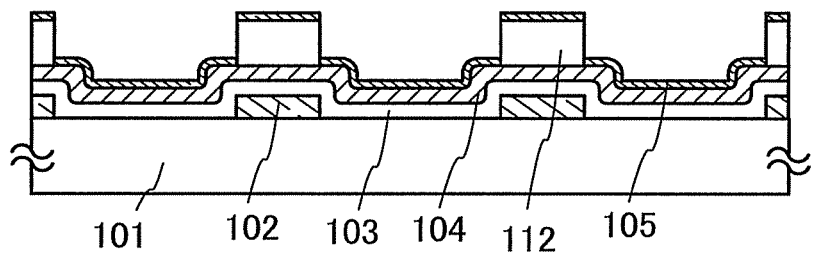

The thickness of the heat-insulating layer 112, which is the second heat-insulating layer, is preferably larger than that of the heat-insulating layer 103. Specifically, the thickness of the heat-insulating layer 112 is preferably from 1 μm to 10 μm. When the thickness of the heat-insulating layer 112 is increased, the above-described effects of providing the heat-insulating layer 112 become more significant. In addition, as illustrated in FIG. 3B, by increase in the thickness of the heat-insulating layer 112, the material layer 105 to be formed over the heat-insulating layer 112 becomes discontinuous; thus, heat transfer in a plane direction of the material layer 105 can be prevented, and deformation of a deposition pattern can be further prevented.

Figure 3C:
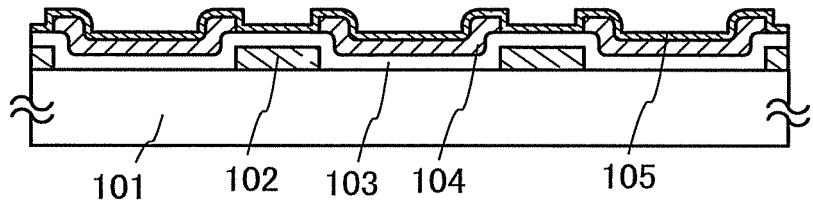

Note that while the light-absorbing layer 104 is formed over the entire surface of the first substrate 101 in FIGS. 1A to 1E, the light-absorbing layer 104 may be selectively formed as illustrated in FIG. 3C. The light-absorbing layer 104, which is patterned into an island shape, can prevent misalignment and/or deformation of a deposition pattern on the deposition surface, which is caused by heating of the material layer 105 formed in a region overlapping with the reflective layer 102 by transfer in a plane direction of heat in the light-absorbing layer 104 in light irradiation for deposition. Note that, although FIG. 3C illustrates the case where the end portions of the reflective layer 102 are aligned with the end portions of the light-absorbing layer 104, the reflective layer 102 and the light-absorbing layer 104 may partially overlap with each other so that the deposition substrate is not irradiated with light.

Figure 3D:
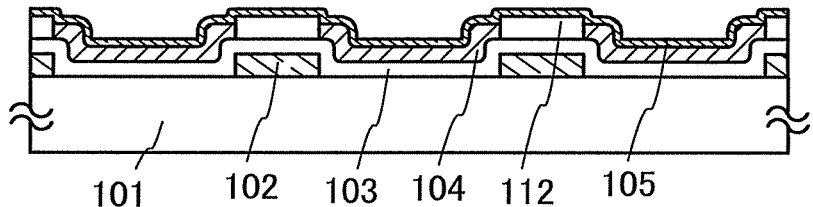

In addition to the structure illustrated in FIG. 3C, a heat-insulating layer 112 which is the second heat-insulating layer may be formed as illustrated in FIG. 3D. In the structure in FIG. 3D, the reflective layer 102, the heat-insulating layer 103, and the light-absorbing layer 104 are formed in that order over the first substrate 101; the heat-insulating layer 112 is formed at a position overlapping with the reflective layer 102; and the material layer 105 is formed over the light-absorbing layer 104 and the heat-insulating layer 112.

Figure 4A:
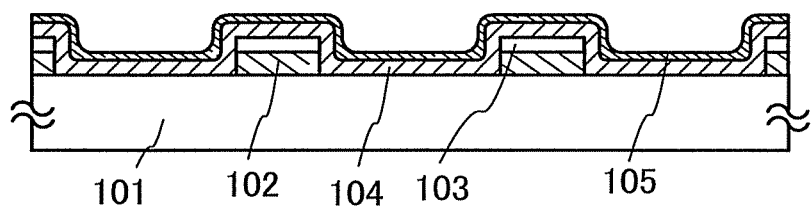
FIGS. 4A to 4D are cross-sectional views showing an example of a film-formation substrate according to an embodiment of the present invention.
Figure 4B:
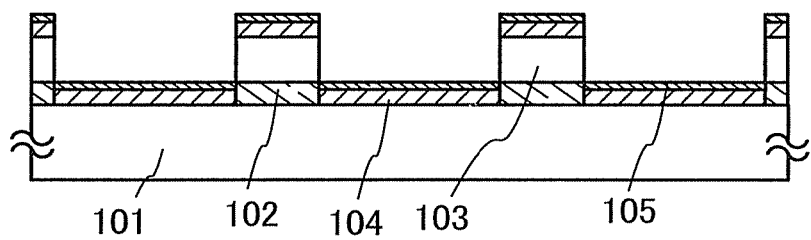

Further, as illustrated in FIG. 4A, the heat-insulating layer 103 may be patterned into an island shape. At this time, the heat-insulating layer 103 is formed so as to overlap with the reflective layer 102 and not to be formed in the opening portion 106. Even when the heat-insulating layer 103 is formed into an island shape as in FIG. 4A, deformation of a deposition pattern can be prevented. In addition, by patterning of the heat-insulating layer 103 into an island shape in this manner, the thickness of the heat-insulating layer 103 can be increased more than in the case where the heat-insulating layer 103 is also formed in the opening portion. For example, as illustrated in FIG. 4B, the thickness of the heat-insulating layer 103 can be increased so that the light-absorbing layer 104 and the material layer 105 are discontinuous.

Figure 4C:
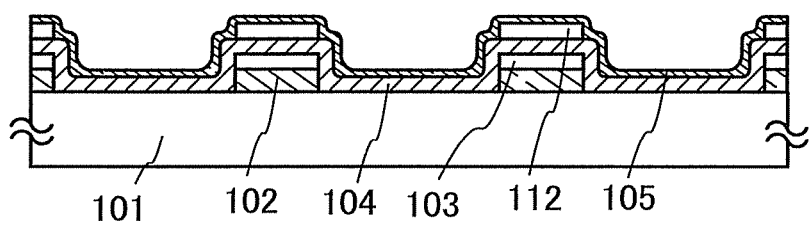

In addition, as illustrated in FIG. 4C, the heat-insulating layer 112 which is the second heat-insulating layer can be additionally provided for the structure illustrated in FIG. 4A. In the structure in FIG. 4C, a heat-insulating layer 112 is formed at a position which overlaps with the reflective layer 102, and which is above the reflective layer 102, the heat-insulating layer 103, and the light-absorbing layer 104 formed in that order over the first substrate 101. Also in FIG. 4C, the material layer 105 is formed over the light-absorbing layer 104 and the heat-insulating layer 112. With such a structure, deformation of the deposition pattern can be prevented more.

Figure 4D:
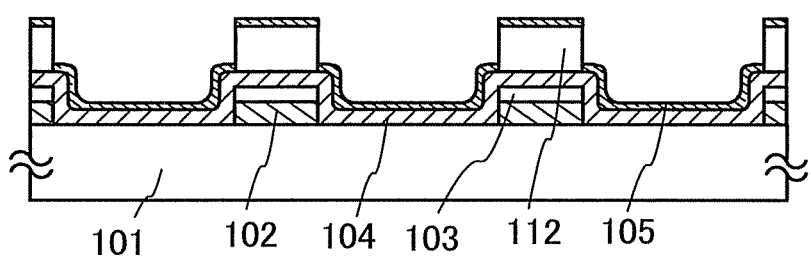

As illustrated in FIG. 4D, the thickness of the heat-insulating layer 112 is preferably larger than that of the heat-insulating layer 103. With the increase in thickness of the heat-insulating layer 112, an effect of provision of the above second heat-insulating layer is more marked. By increasing the thickness of the heat-insulating layer 112, the material layer 105 becomes discontinuous; thus, heat transfer in a plane direction of the material layer 105 can be prevented, and deformation of a deposition pattern can be prevented much more.

The film-formation substrate illustrated in FIGS. 3A to 3D and FIGS. 4A to 4D is irradiated with light as in Embodiment 1 so that a desired-patterned film can be deposited on the deposition substrate. Accordingly, an effect similar to that of Embodiment 1 can be obtained by using the film-formation substrate described in Embodiment 2.

According to the present invention, a minute pattern thin film can be deposited on the deposition substrate without provision of a mask between the material and the deposition substrate.

Embodiment 3

Embodiment 3 will describe a method for manufacturing a light-emitting device which is capable of full-color display by forming an EL layer of a light-emitting element with a plurality of film-formation substrates which are described in Embodiment 1 and Embodiment 2.

In the present invention, EL layers of the same kind of material can be formed on all of the plurality of electrodes on a second substrate, which is a deposition substrate, through one film-formation process. Further, in the present invention, EL layers for emission of three different colors can be formed on the plurality of electrodes on the second substrate.

First, three film-formation substrates, which are each the film-formation substrate in e.g., FIG. 1A in Embodiment 1, are prepared. Note that a material layer containing a material for forming an EL layer of a different emission color is formed in each film-formation substrate. Specifically, a first film-formation substrate having a material layer (R) for forming an EL layer exhibiting red light emission (an EL layer (R)), a second film-formation substrate having a material layer (G) for forming an EL layer exhibiting green light emission (an EL layer (G)), and a third film-formation substrate having a material layer (B) for forming an EL layer exhibiting blue light emission (an EL layer (B)) are prepared.

In addition, one deposition substrate having a plurality of first electrodes is prepared. Note that since end portions of the plurality of first electrodes on the deposition substrate are covered with an insulating layer, a light-emitting region corresponds to a part of the first electrode which is exposed without being overlapped with the insulating layer.

First, the deposition substrate and the first film-formation substrate are superimposed and aligned for a first deposition process, as in FIG. 1C. The deposition substrate is preferably provided with an alignment marker. The first film-formation substrate is preferably also provided with an alignment marker. Note that because the first film-formation substrate is provided with a light-absorbing layer, a portion of the light-absorbing layer near the alignment marker is desirably removed in advance. In addition, because the first film-formation substrate is provided with the material layer (R), a portion of the material layer (R) near the alignment marker is also desirably removed in advance.

Then, a rear surface of the first film-formation substrate (the surface on which the reflective layer 102, the heat-insulating layer 103, the light-absorbing layer 104, and the material layer 105, which are illustrated in FIGS. 1A to 1D, are not formed) is irradiated with light. The light-absorbing layer absorbs light and provides heat to the material layer (R) to heat the material contained in the material layer (R). Thus, an EL layer (R) 411 is formed on some of the first electrodes on the deposition substrate. After the first deposition is finished, the first film-formation substrate is moved away from the deposition substrate.

Next, the deposition substrate and the second film-formation substrate are superimposed and aligned for a second deposition process. The second film-formation substrate is provided with a reflective layer having an opening portion at a position which is shifted by one pixel from the first film-formation substrate, which has been used in the first deposition.

Then, a rear surface of the second film-formation substrate (the surface on which the reflective layer 102, the heat-insulating layer 103, the light-absorbing layer 104, and the material layer 105, which are illustrated in FIGS. 1A to 1D, are not formed) is irradiated with light. The light-absorbing layer absorbs light and provides heat to the material layer (G) to heat the material contained in the material layer (G). Thus, EL layers (G) are formed on some of the first electrodes on the deposition substrate, which are next to the first electrodes on which the EL layers (R) are formed in the first deposition. After the second deposition is finished, the second film-formation substrate is moved away from the deposition substrate.

Next, the deposition substrate and the third film-formation substrate are superimposed and aligned for a third deposition process. The third film-formation substrate is provided with a reflective layer having an opening portion at a position which is shifted by two pixels from the first film-formation substrate, which has been used in the first deposition.

Figure 10A:
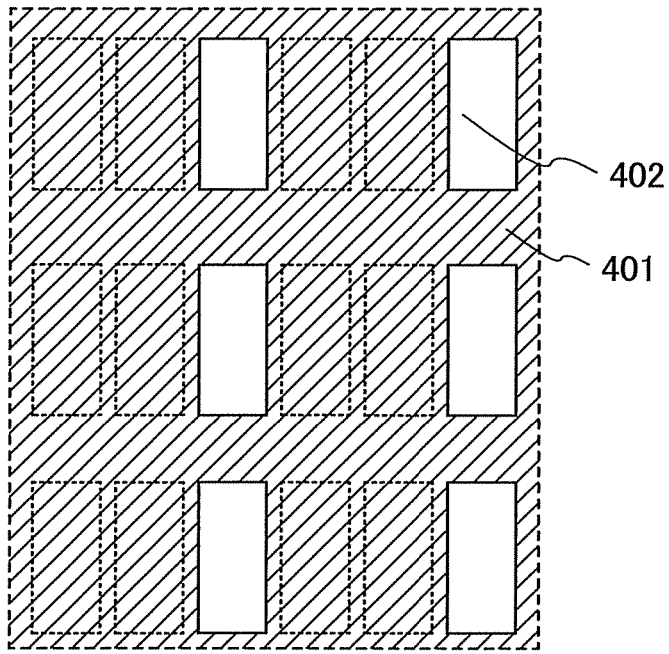
FIGS. 10A and 10B are plan views showing a manufacturing process of a light-emitting device according to an embodiment of the present invention.

Then, a rear surface of the third film-formation substrate (the surface on which the reflective layer 102, the heat-insulating layer 103, the light-absorbing layer 104, and the material layer 105, which are illustrated in FIGS. 1A to 1D, are not formed) is irradiated with light. A state of the third film-formation substrate right before the third deposition corresponds to the plan view of FIG. 10A. In FIG. 10A, a reflective layer 401 has an opening portion 402. Accordingly, light which have passed through the opening portion 402 of the reflective layer 401 of the third film-formation substrate is transmitted through the heat-insulating layer and is absorbed by the light-absorbing layer. A region of the deposition substrate which corresponds to the opening portion 402 of the third film-formation substrate is provided with one of the first electrodes. In addition, below regions indicated by dotted lines in FIG. 10A, the EL layer (R) 411 formed through the first deposition and the EL layer (G) 412 formed through the second deposition are located.

Then, EL layers (B) 413 are formed through the third deposition. The light-absorbing layer absorbs irradiation light and provides heat to the material layer (B) to heat the material contained in the material layer (B). Thus, the EL layers (B) 413 are formed on some of the first electrodes on the deposition substrate, which are next to the first electrodes on which the EL layers (G) 412 are formed in the second deposition. After the third deposition is finished, the third film-formation substrate is moved away from the deposition substrate.

In this manner, the EL layers (R) 411, the EL layers (G) 412, and the EL layers (B) 413 can be formed at certain intervals on one deposition substrate. Then, second electrodes are formed over these layers. Thus, light-emitting elements can be formed.

Through the above steps, light-emitting elements which exhibit light emission of different colors are formed over one substrate, whereby a light-emitting device capable of full-color display can be formed.

Figure 10B:
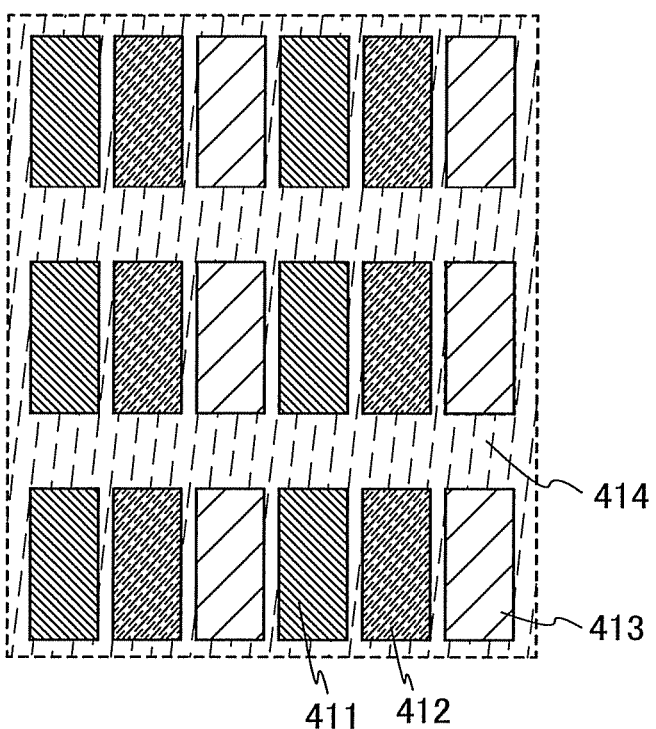

FIGS. 10A and 10B show the example in which the opening portion 402 in the reflective layer formed over the film-formation substrate has a rectangular shape. However, the present invention is not particularly limited to this example and stripe opening portions may be employed. In the case where the stripe opening portions are employed, although deposition is also performed between light-emitting regions for emitting light of the same color, the deposition between light-emitting regions is performed over the insulating layer 414, and thus a portion overlapping with the insulating layer 414 does not serve as a light-emitting region.

Figure 11A:
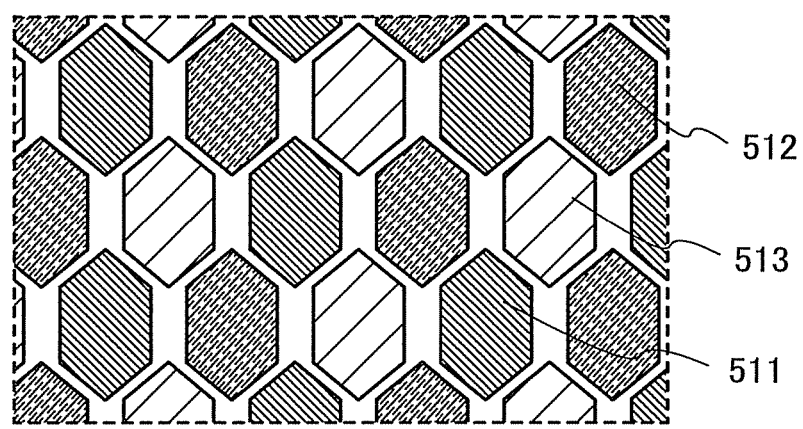
FIGS. 11A and 11B are plan views showing a manufacturing process of a light-emitting device according to an embodiment of the present invention.
Figure 11B:
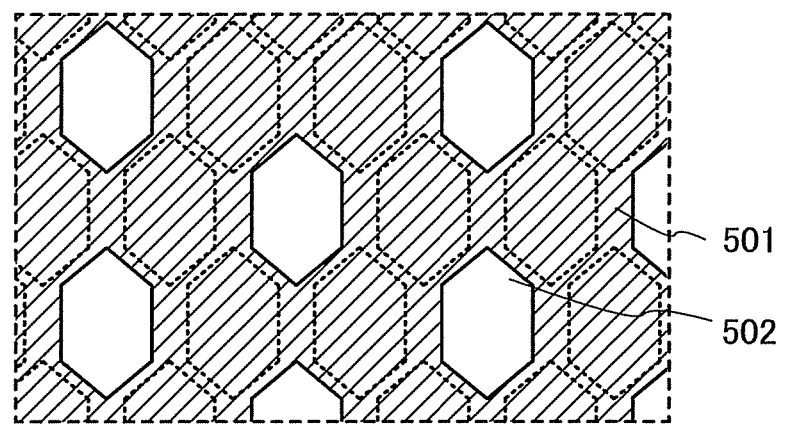

Similarly, there are no particular limitations on the arrangement of the pixels. The shape of each pixel may be a polygon, for example, a hexagon as illustrated in FIG. 11A, and a full-color light-emitting device may be realized by arrangement of the EL layer (R) 511, the EL layer (G) 512, and the EL layer (B) 513. In order to form polygonal pixels in FIG. 1A, deposition may be performed using an film-formation substrate which includes a reflective layer 501 having polygonal opening portions 502 as illustrated in FIG. 11B.

In manufacture of a light-emitting device capable of full-color display which is described in Embodiment 3, the thickness of the film which is deposited on the deposition substrate can be controlled by controlling the thickness of a material layer which is formed over the film-formation substrate. In other words, since the thickness of the material layer is controlled in advance so that a film to be deposited on the deposition substrate can have a desired thickness by depositing the whole material contained in the material layer formed over the film-formation substrate, a thickness monitor is not needed in the deposited on the deposition substrate. Therefore, a user does not have to adjust the deposition rate with a thickness monitor, and the film-formation process can be fully automated. Accordingly, productivity can be improved.

In addition, in manufacture of a light-emitting device capable of full-color display which is described in Embodiment 3, by applying the present invention, an material contained in the material layer which is over the film-formation substrate can be uniformly deposited. In the case where the material layer contains plural kinds of materials, a film containing the same materials at roughly the same weight ratio as those of the material layer can be deposited on the deposition substrate. Therefore, in a film-formation method according to the present invention, if deposition is performed using plural kinds of materials having different deposition temperatures, a desired layer containing different kinds of materials can be deposited easily and accurately without complicated control of the deposition rate or the like.

Further, in manufacture of a light-emitting device capable of full-color display which is described in Embodiment 3, a desired material can be deposited on the deposition substrate without being wasted, according to the present invention. Thus, efficiency in material use is increased, which can lead to reduction in manufacturing cost. Moreover, a material can be prevented from being attached to an inner wall of a deposition chamber, and thus maintenance of a film-formation apparatus can be facilitated.

In addition, in manufacture of a light-emitting device capable of full-color display which is described in Embodiment 3, by applying the present invention, a flat and even film can be deposited, and a minute pattern can be formed; thus, a high-definition light-emitting device can be obtained.

Further, since the application of the present invention enables selective deposition at a desired region at the time of deposition using laser light, efficiency in material use can be increased and formation of a film of a desired shape with high accuracy is easily performed; thus, productivity of a light-emitting device can be increased. Moreover, in the present invention, laser light having a high output can be used as a light source, and thus deposition over a large area can be performed. Thus, time taken for deposition (takt time) can be shortened, which can lead to increase in productivity.

Note that the structure in Embodiment 3 can be combined with any structure of Embodiments 1 and 2 as appropriate.

Embodiment 4

Embodiment 4 will describe a method for manufacturing a light-emitting element and a light-emitting device according to the present invention.

Figure 12A:
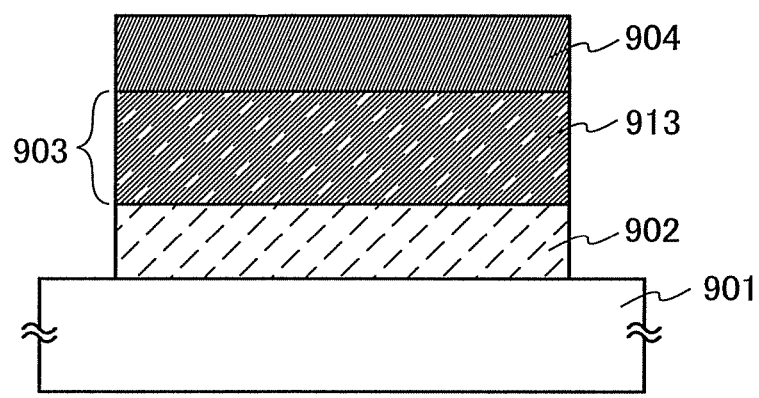
FIGS. 12A and 12B are cross-sectional views each illustrating a structure of a light-emitting element applicable to the present invention
Figure 12B:
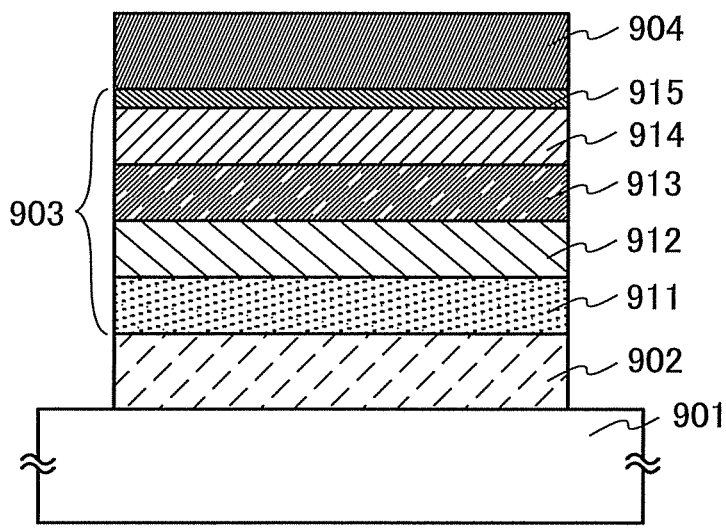

According to the present invention, for example, light-emitting elements illustrated in FIGS. 12A and 12B can be manufactured. In the light-emitting element illustrated in FIG. 12A, a first electrode 902, an EL layer 903 which includes only a light-emitting layer 913, and a second electrode 904 are stacked in that order over a substrate 901. One of the first electrode 902 and the second electrode 904 functions as an anode, and the other functions as a cathode. Holes injected from an anode and electrons injected from a cathode are recombined in the EL layer 903, whereby light can be emitted. In this embodiment, the first electrode 902 functions as the anode and the second electrode 904 functions as the cathode.

In the light-emitting element illustrated in FIG. 12B, the EL layer 903 in FIG. 12A has a stacked structure including a plurality of layers. Specifically, a hole-injecting layer 911, a hole-transporting layer 912, the light-emitting layer 913, an electron-transporting layer 914, and an electron-injecting layer 915 are provided in that order from the first electrode 902 side. Note that the EL layer 903 can function as long as it includes at least the light-emitting layer 913 as in FIG. 12A; therefore, all of the above layers are not always necessary and may be selected as appropriate to be provided as needed.

As the substrate 901 in FIGS. 12A and 12B, a substrate having an insulating surface or an insulating substrate is employed. Specifically, any of a variety of glass substrates used for the electronics industry such as an aluminosilicate glass substrate, an aluminoborosilicate glass substrate, or a barium borosilicate glass substrate; a quartz substrate; a ceramic substrate; a sapphire substrate; or the like can be used.

For the first electrode 902 and the second electrode 904, any of various types of metals, alloys, electrically conductive compounds, mixtures thereof, and the like can be used. Specific examples thereof include indium tin oxide (ITO), indium tin oxide containing silicon or silicon oxide, indium zinc oxide (IZO), and indium oxide containing tungsten oxide and zinc oxide. In addition, gold (Au), platinum (Pt), nickel (Ni), tungsten (W), chromium (Cr), molybdenum (Mo), iron (Fe), cobalt (Co), copper (Cu), palladium (Pd), nitride of a metal material (such as titanium nitride), and the like can be given.

A film of any of those materials is generally formed by sputtering. For example, a film of indium zinc oxide can be formed by a sputtering method using a target in which zinc oxide is added to indium oxide at 1 to 20 wt %. A film of indium oxide containing tungsten oxide and zinc oxide can be formed by a sputtering method using a target in which tungsten oxide and zinc oxide are added to indium oxide at 0.5 to 5 wt % and 0.1 to 1 wt %, respectively. Further, a film of any of those materials may be formed by an ink-jet method, a spin coating method, or the like by application of a sol-gel process or the like.

Furthermore, aluminum (Al), silver (Ag), an alloy containing aluminum, or the like can be used. Moreover, any of the following materials having a low work function can be used: elements which belong to Group 1 and Group 2 of the periodic table, that is, alkali metals such as lithium (Li) and cesium (Cs) and alkaline-earth metals such as magnesium (Mg), calcium (Ca), and strontium (Sr), and alloys thereof (an alloy of aluminum, magnesium, and silver, and an alloy of aluminum and lithium); rare earth metals such as europium (Eu) and ytterbium (Yb), and alloys thereof; and the like.

A film of an alkali metal, an alkaline earth metal, and an alloy thereof can be formed by a vacuum evaporation method. A film of an alloy containing an alkali metal or an alkaline earth metal can be formed by a sputtering method. Further, a film of a silver paste or the like can be formed by an ink-jet method or the like. The first electrode 902 and the second electrode 904 are not limited to a single-layer film and can be formed as a stacked-layer film.

Note that in order to extract light emitted from the EL layer 903 to the outside, one or both of the first electrode 902 and the second electrode 904 is/are formed so as to transmit light. For example, one or both of the first electrode 902 and the second electrode 904 is/are formed using a conductive material having a light-transmitting property, such as indium tin oxide, or formed using silver, aluminum, or the like with a thickness of several nanometers to several tens of nanometers. Alternatively, a stacked-layer structure can be employed, which includes a thin film of a metal such as silver, aluminum, or the like with a reduced thickness and a thin film of a conductive material having a light-transmitting property, such as ITO.

The EL layer 903 (the hole-injecting layer 911, the hole-transporting layer 912, the light-emitting layer 913, the electron-transporting layer 914, or the electron-injecting layer 915) of the light-emitting element of this embodiment can be formed by application of the film-formation method described in Embodiment 1. In addition, the electrodes can also be formed by the film-formation method described in Embodiment 1.

For example, in the case where the light-emitting element illustrated in FIG. 12A is formed, a material layer of the film-formation substrate described in Embodiment 1 is formed using a material for the EL layer 903, and the EL layer 903 is formed on the first electrode 902 on the substrate 901 using the film-formation substrate. Then, the second electrode 904 is formed over the EL layer 903, whereby the light-emitting element in FIG. 12A can be obtained.

When the light-emitting layer 913 is formed by a film-formation method of the present invention, N-(9,10-diphenyl-2-anthryl)-N,9-diphenyl-9H-carbazol-3-amine (abbreviation: 2PCAPA) or (acetylacetonato)bis(2,3,5-triphenylpyrazinato)iridium(III) (abbreviation: Ir(tppr)$_2$(acac)) can be used as a light-emitting material, for example. In the case where 2PCAPA is used as the light-emitting material, a liquid composition obtained by dissolving 9-[4-(9H-carbazolyl)phenyl]-10-phenylanthracene (abbr.: CZPA) and 2PCAPA in a toluene solvent is used to form the material layer over the film-formation substrate by a wet process.

When Ir(tppr)$_2$(acac) is used as the light-emitting material, a liquid composition obtained by dissolving bis(2-methyl-8-quinolinolato)(4-phenylphenolato)aluminum(III) (abbr.: BAlq), N,N'-bis(3-methylphenyl)-N,N'-diphenyl-[1,1'-biphenyl]-4,4'-diamine (abbr.: TPD), and Ir(tppr)$_2$(acac) in a solvent of 2-methoxyethanol is used to form the material layer over the film-formation substrate by a wet process.

Either of the material layers including 2PCAPA or Ir(tppr)$_2$(acac) is deposited on the electrode on the deposition substrate by irradiation of the light-absorbing layer with laser light.

A variety of materials can be used for the light-emitting layer 913. For example, a fluorescent compound which exhibits fluorescence or a phosphorescent compound which exhibits phosphorescence can be used.

Examples of a phosphorescent compound which is used for the light-emitting layer 913 include the following organometallic complexes. As a material for blue light emission, bis[2-(4',6'-difluorophenyl)pyridinato-N,C$^{2'}$]iridium(III)tetrakis(1-pyrazolyl)borate (abbr.: FIr6), bis[2-(4',6'-difluorophenyl)pyridinato-N,C$^{2'}$]iridium(III)picolinate (abbr.: FIrpic), bis[2-(3',5'bistrifluoromethylphenyl)pyridinato-N,C$^{2'}$]iridium(III) picolinate (abbr.: Ir(CF$_3$ ppy)$_2$(pic)), bis[2-(4',6'-difluorophenyl)pyridinato-N,C$^{2'}$]iridium(III)acetylacetonate (abbr.: FIr(acac)) or the like can be given. As a material for green light emission, tris(2-phenylpyridinato-N,C$^{2'}$)iridium (III) (abbr.: Ir(ppy)$_3$), bis[2-phenylpyridinato-N,C$^{2'}$]iridium (III)acetylacetonate (abbr.: Ir(ppy)$_2$(acac)), bis(1,2-diphenyl-1H-benzimidazolato)iridium(III)acetylacetonate (abbr.: Ir(pbi)$_2$(acac)), bis(benzo[h]quinolinato)iridium(III)acetylacetonate (abbr.: Ir(bzq)$_2$(acac)) or the like can be given. As a material for yellow light emission, bis(2,4-diphenyl-1,3-oxazolato-N,C$^{2'}$)iridium(III)acetylacetonate (abbr.: Ir(dpo)$_2$(acac)), bis[2-(4'-perfluorophenylphenyl)pyridinato]iridium (III)acetylacetonate (abbr.: Ir(p-PF-ph)$_2$(acac)), bis(2-phenylbenzothiazolato-N,C$^{2'}$)iridium(III)acetylacetonate (abbr.: Ir(bt)$_2$(acac)) or the like can be given. As a material for orange light emission, tris(2-phenylquinolinato-N,C$^{2'}$)iridium(III) (abbr.: Ir(pq)$_3$), bis(2-phenylquinolinato-N,C$^{2'}$)iridium(III)acetylacetonate (abbr.: Ir(pq)$_2$(acac)) or the like can be given. As a material for red light emission, organometallic complex such as bis[2-(2'-benzo[4,5-a]thienyl)pyridinato-N,C$^{3'}$]iridium(III)acetylacetonate (abbr.: Ir(btp)$_2$(acac)), bis(1-phenylisoquinolinato-N,C$^{2'}$)iridium(III)acetylacetonate (abbr.: Ir(piq)$_2$(acac)), (acetylacetonato)bis[2,3-bis(4-fluorophenyl)quinoxalinato]iridium(III) (abbr.: Ir(Fdpq)$_2$(acac)), or (2,3,7,8,12,13,17,18-octaethyl-21H,23H-porphyrinato) platinum(II) (abbr.: PtOEP) can be given. In addition, a rare earth metal complex such as tris(acetylacetonato) (monophenanthroline)terbium(III) (abbr.: Tb(acac)$_3$(Phen)), tris(1,3-diphenyl-1,3-propanedionato)(monophenanthroline)europium(III) (abbr.: Eu(DBM)$_3$(Phen)), or tris[1-(2-thenoyl)-3,3,3-trifluoroacetonato](monophenanthroline)europium(III) (abbr.: Eu(TTA)$_3$(Phen)) performs light emission (electron transition between different multiplicities) from a rare earth metal ion; therefore, such a rare earth metal complex can be used as a phosphorescent compound.

Examples of a fluorescent compound which is used for the light-emitting layer 913 are given below. As a material for blue light emission, N,N'-bis[4-(9H-carbazol-9-yl)phenyl]-N,N'-diphenylstilbene-4,4'-diamine (abbr.: YGA2S), 4-(9H-carbazol-9-yl)-4'-(10-phenyl-9-anthryl)triphenylamine (abbr.: YGAPA), or the like can be given. As a material for green light emission, N-(9,10-diphenyl-2-anthryl)-N,9-diphenyl-9H-carbazol-3-amine (abbreviation, 2PCAPA), N-[9,10-bis(1,1'-biphenyl-2-yl)-2-anthryl]-N,9-diphenyl-9H-carbazol-3-amine (abbr.: 2PCABPhA), N-(9,10-diphenyl-2-anthryl)-N,N',N'-triphenyl-1,4-phenylenediamine (abbr.: 2DPAPA), N-[9,10-bis(1,1'-biphenyl-2-yl)-2-anthryl]-N,N',N'-triphenyl-1,4-phenylenediamine (abbr.: 2DPABPhA), 9,10-bis(1,1'-biphenyl-2-yl)-N-[4-(9H-carbazol-9-yl)phenyl]-N-phenylanthracen-2-amine (abbr.:

2YGABPhA), N,N,9-triphenylanthracen-9-amine (abbr.: DPhAPhA), or the like can be given. As a material for yellow light emission, rubrene, 5,12-bis(1,1'-biphenyl-4-yl)-6,11-diphenyltetracene (abbr.: BPT), or the like can be given. As a material for red light emission, N,N,N',N'-tetrakis(4-methylphenyl)tetracene-5,11-diamine (abbr.: p-mPhTD), 7,13-diphenyl-N,N,N',N'-tetrakis(4-methylphenyl)acenaphtho[1,2-α]fluoranthene-3,10-diamine (abbr.: p-mPhAFD), or the like can be given.

The light-emitting layer 913 may include a substance having a high light-emitting property (dopant material) dispersed in another substance (host material), whereby crystallization of the light-emitting layer can be suppressed. In addition, concentration quenching which results from high concentration of the substance having a high light-emitting property can be suppressed.

As the substance in which the substance having a high light-emitting property is dispersed, when the substance having a high light-emitting property is a fluorescent compound, a substance having higher singlet excitation energy (the energy difference between a ground state and a singlet excited state) than the fluorescent compound is preferably used. When the substance having a high light-emitting property is a phosphorescent compound, a substance having higher triplet excitation energy (the energy difference between a ground state and a triplet excited state) than the phosphorescent compound is preferably used.

Examples of host materials used for the light-emitting layer 913 are given below: 4,4'-bis[N-(1-naphthyl)-N-phenylamino]biphenyl (abbr.: NPB), tris(8-quinolinolato)aluminum(III) (abbr.: Alq), 4,4'-bis[N-(9,9-dimethylfluoren-2-yl)-N-phenylamino]biphenyl (abbr.: DFLDPBi), bis(2-methyl-8-quinolinolato)(4-phenylphenolato)aluminum(III) (abbr.: BAlq), 4,4'-di(9-carbazolyl)biphenyl (abbr.: CBP), 2-tert-butyl-9,10-di(2-naphthyl)anthracene (abbr.: t-BuDNA), and 9-[4-(9-carbazolyl)phenyl]-10-phenylanthracene (abbr.: CZPA).

As the dopant material, any of the above-mentioned phosphorescent compounds and fluorescent compounds can be used.

When the light-emitting layer 913 is a layer in which a substance having a high light-emitting property (dopant material) is dispersed in another substance (host material), a mixed layer of a host material and a guest material may be formed as the material layer over the film-formation substrate. Alternatively, the material layer over the film-formation substrate may have a structure in which a layer containing a host material and a layer containing a dopant material are stacked. By forming the light-emitting layer 913 using an film-formation substrate with the material layer having such a structure, the light-emitting layer 913 contains a substance in which a light-emitting material is dispersed (host material) and a substance having a high light-emitting property (dopant material), and has a structure in which the substance having a high light-emitting property (dopant material) is dispersed in the substance in which a light-emitting material is dispersed (host material). Note that for the light-emitting layer 913, two or more kinds of host materials and a dopant material may be used, or two or more kinds of dopant materials and a host material may be used. Alternatively, two or more kinds of host materials and two or more kinds of dopant materials may be used.

In the case where the light-emitting element illustrated in FIG. 12B is formed, the film-formation substrate described in Embodiment 1 which has a material layer formed using a material for forming each layer in the EL layer 903 (the hole-injecting layer 911, the hole-transporting layer 912, the light-emitting layer 913, the electron-transporting layer 914, and the electron-injecting layer 915) is prepared for each layer, and deposition of each layer is performed using a different film-formation substrate by the method described in Embodiment 1, whereby the EL layer 903 is formed on the first electrode 902 on the substrate 901. Then, the second electrode 904 is formed on the EL layer 903, and thus the light-emitting element in FIG. 12B can be formed. Note that although all the layers in the EL layer 903 can be formed by the method described in Embodiment 1 in this case, only some of the layers in the EL layer 903 may be formed by the method described in Embodiment 1.

When a film is stacked over a deposition substrate by a wet process, a liquid composition containing a material is applied directly on an underlying film, and thus the underlying film may dissolved by a solvent of the liquid composition depending on the solvent used; therefore, a material that can be stacked thereon is limited. However, in the case of forming a stack by a film-formation method of the present invention, a solvent is not directly attached to an underlying film and thus it is unnecessary to consider influence of the solvent to the underlying film. Accordingly, materials used for stacking layers can be selected from a wider range. In addition, since a material layer is formed over the film-formation substrate which is different from the deposition substrate by a wet process, heat treatment to remove the solvent and to improve film quality can be conducted sufficiently. On the other hand, if a film is formed directly over a deposition substrate by a wet process, it is necessary to conduct heat treatment under such heating conditions that do not influence an underlying film which has been formed over the deposition substrate, and sufficient improvement in film quality cannot be achieved in some cases.

For example, the hole-injecting layer 911 can be formed using molybdenum oxide, vanadium oxide, ruthenium oxide, tungsten oxide, manganese oxide, or the like. Alternatively, the hole-injecting layer can be formed using a phthalocyanine-based compound such as phthalocyanine (abbr.: $H_2Pc$) or copper phthalocyanine (abbr.: CuPc), a high molecular compound such as poly(3,4-ethylenedioxythiophene)/poly(styrenesulfonate) (PEDOT/PSS), or the like.

As the hole-injecting layer 911, a layer which contains a substance having a high hole-transporting property and a substance having an electron-accepting property can be used. The layer which contains a substance having a high hole-transporting property and a substance having an electron-accepting property has high carrier density and an excellent hole-injecting property. When the layer which contains a substance having a high hole-transporting property and a substance having an electron-accepting property is used as a hole-injecting layer which is in contact with an electrode that functions as an anode, any of a variety of metals, alloys, electrically conductive compounds, mixtures thereof, and the like can be used regardless of the work function of a material of the electrode which functions as an anode.

Examples of the substance having an electron-accepting property which is used for the hole-injecting layer 911 are given below: 7,7,8,8-tetracyano-2,3,5,6-tetrafluoroquinodimethane (abbr.: F4-TCNQ), chloranil, and the like. Other examples are transition metal oxides. Still other examples are oxide of metal belonging to Group 4 to Group 8 of the periodic table. Specifically, vanadium oxide, niobium oxide, tantalum oxide, chromium oxide, molybdenum oxide, tungsten oxide, manganese oxide, and rhenium oxide are preferable because of their high electron-accepting properties. Among them, molybdenum oxide is especially preferable because it is stable also in the atmosphere, has a low hygroscopic property, and can be easily handled.

As the substance having a high hole-transporting property used for the hole-injecting layer 911, any of various compounds such as an aromatic amine compound, a carbazole derivative, an aromatic hydrocarbon, and a high molecular compound (such as an oligomer, a dendrimer, and a polymer) can be used. Note that the substance having a high hole-transporting property used for the hole-injecting layer is preferably a substance having a hole mobility of $10^{-6}$ cm$^2$/Vs or higher. Note that any of other substances that have a hole-transporting property higher than an electron-transporting property may be used. Specific examples of the substance having a high hole-transporting property, which can be used for the hole-injecting layer 911, are given below.

Examples of an aromatic amine compound which can be used for the hole-injecting layer 911 are given below; 4,4'-bis[N-(1-naphthyl)-N-phenylamino]biphenyl (abbr.: NPB), N,N'-bis(3-methylphenyl)-N,N'-diphenyl-[1,1'-biphenyl]-4,4'-diamine (abbr.: TPD), 4,4',4''-tris(N,N-diphenylamino)triphenylamine (abbr.: TDATA), 4,4',4''-tris[N-(3-methylphenyl)-N-phenylamino]triphenylamine (abbr.: MTDATA), 4,4'-bis[N-(spiro-9,9'-bifluoren-2-yl)-N-phenylamino]biphenyl (abbr.: BSPB), and the like. Other examples are as follows: N,N-bis(4-methylphenyl)(p-tolyl)-N,N'-diphenyl-p-phenylenediamine (abbr.: DTDPPA), 4,4'-bis[N-(4-diphenylaminophenyl)-N-phenylamino]biphenyl (abbr.: DPAB), 4,4'-bis(N-{4-[N-(3-methylphenyl)-N'-phenylamino]phenyl}-N-phenylamino)biphenyl (abbr.: DNTPD), and 1,3,5-tris[N-(4-diphenylaminophenyl)-N-phenylamino]benzene (abbr.: DPA3B).

Specific examples of a carbazole derivative which can be used for the hole-injecting layer 911 are given below: 3-[N-(9-phenylcarbazol-3-yl)-N-phenylamino]-9-phenylcarbazole (abbr.: PCzPCA1), 3,6-bis[N-(9-phenylcarbazol-3-yl)-N-phenylamino]-9-phenylcarbazole (abbr.: PCzPCA2), and 3-[N-(1-naphthyl)-N-(9-phenylcarbazol-3-yl)amino]-9-phenylcarbazole (abbr.: PCzPCN1).

Other examples of a carbazole derivative which can be used for the hole-injecting layer 911 are given below: 4,4'-di(N-carbazolyl)biphenyl (abbr.: CBP), 1,3,5-tris[4-(N-carbazolyl)phenyl]benzene (abbr.: TCPB), 9-[4-(10-phenyl-9-anthryl)phenyl]-9H-carbazole (abbr.: CZPA), and 1,4-bis-[4-(N-carbazolyl)phenyl]-2,3,5,6-tetraphenylbenzene.

Examples of an aromatic hydrocarbon which can be used for the hole-injecting layer 911 are given below: 2-tert-butyl-9,10-di(2-naphthyl)anthracene (abbr.: t-BuDNA), 2-tert-butyl-9,10-di(1-naphthyl)anthracene; 9,10-bis(3,5-diphenylphenyl)anthracene (abbr.: DPPA), 2-tert-butyl-9,10-bis(4-phenylphenyl)anthracene (abbr.: t-BuDBA), 9,10-di(2-naphthyl)anthracene (abbr.: DNA), 9,10-diphenylanthracene (abbr.: DPAnth), 2-tert-butylanthracene (abbr.: t-BuAnth), 9,10-bis(4-methyl-1-naphthyl)anthracene (abbr.: DMNA), 9,10-bis[2-(1-naphthyl)phenyl]-2-tert-butyl-anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Besides, pentacene, coronene, or the like can also be used. As described above, an aromatic hydrocarbon having a hole mobility of $1 \times 10^{-6}$ cm$^2$/Vs or more and having 14 to 42 carbon atoms is preferably used.

Note that an aromatic hydrocarbon which can be used for the hole-injecting layer 911 may have a vinyl skeleton. Examples of an aromatic hydrocarbon having a vinyl group are given below: 4,4'-bis(2,2-diphenylvinyl)biphenyl (abbr.: DPVBi), and 9,10-bis[4-(2,2-diphenylvinyl)phenyl]anthracene (abbr.: DPVPA), and the like.

In addition, the layer which contains a substance having a high hole-transporting property and a substance having an electron-accepting property is excellent in not only a hole-injecting property but also a hole-transporting property, and thus the above-described hole-injecting layer 911 may be used as a hole-transporting layer.

The hole-transporting layer 912 is a layer which contains a substance having a high hole-transporting property. Examples of the substance having a high hole-transporting property are given below: an aromatic amine compound such as 4,4'-bis[N-(1-naphthyl)-N-phenylamino]biphenyl (abbr.: NPB), N,N'-bis(3-methylphenyl)-N,N'-diphenyl-[1,1'-biphenyl]-4,4'-diamine (abbr.: TPD), 4,4',4''-tris(N,N-diphenylamino)triphenylamine (abbr.: TDATA), 4,4',4''-tris[N-(3-methylphenyl)-N-phenylamino]triphenylamine (abbr.: MTDATA), and 4,4'-bis[N-(spiro-9,9'-bifluoren-2-yl)-N-phenylamino]biphenyl (abbr.: BSPB). Most of the substances mentioned here have a hole mobility of $10^{-6}$ cm$^2$/Vs or more. Note that any of other materials which have a hole-transporting property higher than an electron-transporting property may be used. The layer which contains a substance having a high hole-transporting property is not limited to a single layer and may be a stacked layer of two or more layers including the above-mentioned substances.

The electron-transporting layer 914 is a layer which contains a substance having a high electron-transporting property. Examples thereof are given below: metal complexes having a quinoline skeleton or a benzoquinoline skeleton, such as tris(8-quinolinolato)aluminum (abbr.: Alq), tris(4-methyl-8-quinolinolato)aluminum (abbr.: Almq$_3$), bis(10-hydroxybenzo[h]quinolinato)beryllium (abbr.: BeBq$_2$), and bis(2-methyl-8-quinolinolato)(4-phenylphenolato)aluminum (abbr.: BAlq). Other examples are metal complexes having an oxazole-based ligand or a thiazole-based ligand, such as bis[2-(2-hydroxyphenyl)benzoxazolato]zinc (abbr.: Zn(BOX)$_2$), and bis[2-(2-hydroxyphenyl)benzothiazolato]zinc (abbr.: Zn(BTZ)$_2$). Besides metal complexes, other examples are given below: 2-(4-biphenylyl)-5-(4-tert-butylphenyl)-1,3,4-oxadiazole (abbr.: PBD), 1,3-bis[5-(p-tert-butylphenyl)-1,3,4-oxadiazol-2-yl]benzene (abbr.: OXD-7), 3-(4-biphenylyl)-4-phenyl-5-(4-tert-butylphenyl)-1,2,4-triazole (abbr.: TAZ01), bathophenanthroline (abbr.: BPhen), and bathocuproine (abbr.: BCP). Most of the substances mentioned here have an electron mobility of $10^{-6}$ cm$^2$/Vs or higher. Note that any of other materials that have an electron-transporting property higher than a hole-transporting property may be used for the electron-transporting layer. The electron-transporting layer is not limited to a single layer and may be a stacked layer of two or more layers including the above-mentioned substances.

The electron-injecting layer 915 can be formed using an alkali metal compound or an alkaline earth metal compound, such as lithium fluoride (LiF), cesium fluoride (CsF), or calcium fluoride (CaF$_2$). Further, a layer in which a substance having an electron-transporting property is combined with an alkali metal or an alkaline earth metal can be employed. For example, a layer in which Alq includes magnesium (Mg) can be used. Note that the layer in which a substance having an electron-transporting property is combined with an alkali metal or an alkaline earth metal is preferably used as the electron-injecting layer because electrons are efficiently injected from the second electrode 904.

Note that there are no particular limitations on a stacked-layer structure of layers of the EL layer 903. The EL layer 903 may be formed by an appropriate combination of a light-emitting layer with a layer including a substance having a high electron-transporting property, a substance having a high hole-transporting property, a substance having a high electron-injecting property, a substance having a high hole-injecting property, a bipolar substance (a substance having high electron-transporting and hole-transporting properties), or the like.

Light emission from the EL layer 903 is extracted to the outside through one or both of the first electrode 902 and the second electrode 904. Therefore, one or both of the first electrode 902 and the second electrode 904 is/are an electrode having a light-transmitting property. In the case where only the first electrode 902 is an electrode having a light-transmitting property, light is extracted from the substrate 901 side through the first electrode 902. In the case where only the second electrode 904 is an electrode having a light-transmitting property, light is extracted from the side opposite to the substrate 901 side through the second electrode 904. In the case where both the first electrode 902 and the second electrode 904 are electrodes having a light-transmitting property, light is extracted from both the substrate 901 side and the side opposite to the substrate 901 side through the first electrode 902 and the second electrode 904.

Note that, although FIGS. 12A and 12B show the structure in which the first electrode 902 functioning as an anode is provided on the substrate 901 side, the second electrode 904 functioning as a cathode may be provided on the substrate 901 side.

The EL layer 903 is formed by the film-formation method described in Embodiment 1 or may be formed by a combination of the film-formation method described in Embodiment 1 with another film-formation method. A different film formation method may be used to form each electrode or each layer. Examples of a dry method include a vacuum evaporation method, an electron beam evaporation method, a sputtering method, and the like. Examples of a wet method include an inkjet method, a spin coating method, and the like.

In a light-emitting element of Embodiment 4, an EL layer can be formed according to the present invention. Accordingly, a highly accurate film can be formed efficiently. Therefore, not only improvement in characteristics of the light-emitting element, but also improvement in yield and reduction in cost can be achieved.

This embodiment can be combined with any of Embodiments 1 to 3 as appropriate.

Embodiment 5

In Embodiment 5, a passive matrix light-emitting device manufactured according to the present invention will be described with reference to FIGS. 5A and 5B, FIGS. 6A and 6B, FIGS. 7A to 7E, FIGS. 8A to 8C, and FIGS. 9A to 9E.

Figure 5A:
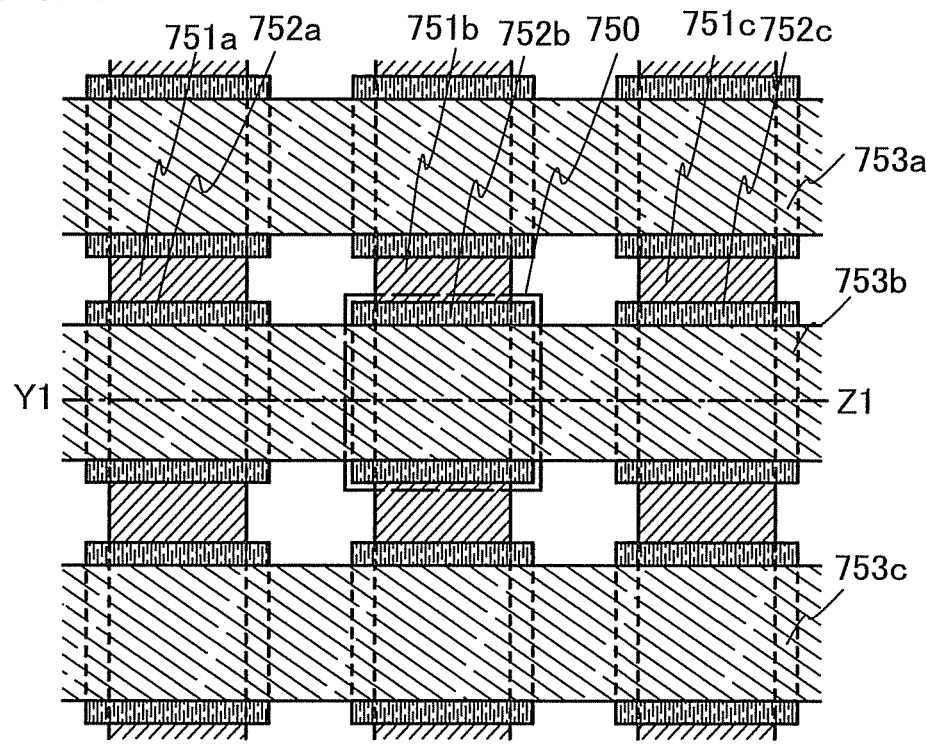
FIGS. 5A and 5B are a plan view and a cross-sectional view of a light-emitting device, respectively, according to an embodiment of the present invention.
Figure 5B:
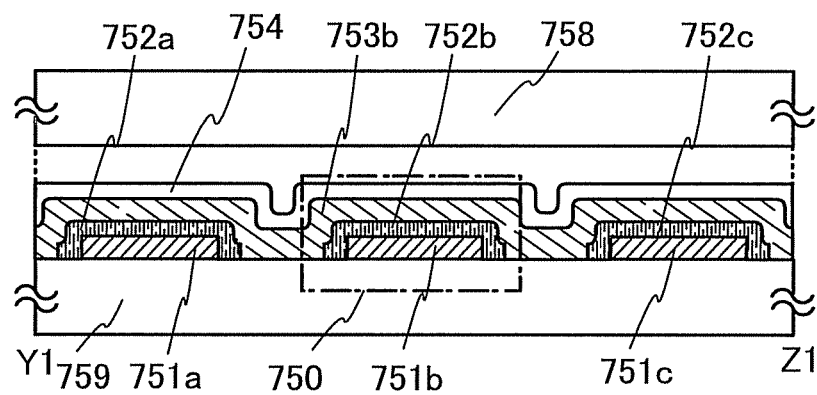

FIGS. 5A and 5B illustrate a light-emitting device having passive matrix light-emitting elements to which the present invention is applied. FIG. 5A is a plan view of the light-emitting device. FIG. 5B is a cross-sectional view taken along a line Y1-Z1 in FIG. 5A.

The light-emitting device illustrated in FIG. 5A has, over an element substrate 759, first electrode layers 751a, 751b, and 751c each of which is extended in the first direction and is an electrode layer used for the light-emitting element; EL layers 752a, 752b, and 752c which are selectively formed over the first electrode layers 751a, 751b, and 751c, respectively; and second electrode layers 753a, 753b, 753c each of which is extended in the second direction perpendicular to the first direction and is an electrode layer used for the light-emitting element. An insulating layer 754 which function as a protective film is provided so as to cover the second electrode layers 753a, 753b, and 753c (see FIGS. 5A and 5B).

In FIGS. 5A and 5B, the first electrode layer 751b which functions as a data line (a signal line) and the second electrode layer 753b which functions as a scan line (a source line) intersect with each other with the EL layer 752b interposed therebetween to form a light-emitting element 750.

In this embodiment, as described in Embodiment 1, the EL layers 752a, 752b, and 752c are formed using a film-formation method of the present invention. A method for manufacturing the light-emitting device of this embodiment illustrated in FIGS. 5A and 5B will be described with reference to FIGS. 7A to 7E.

Figure 7A:
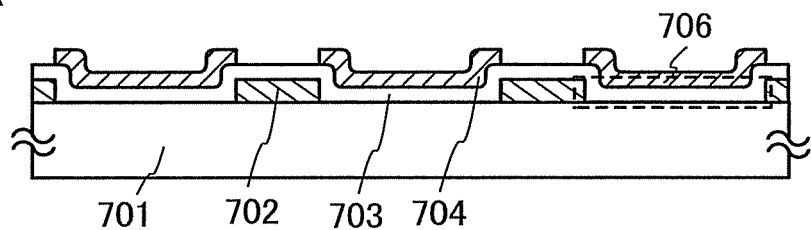
FIGS. 7A to 7E are cross-sectional views showing a manufacturing process of a light-emitting device according to an embodiment of the present invention.

FIG. 7A illustrates a film-formation substrate having a structure which is similar to that illustrated in FIG. 3C described in Embodiment 1. A reflective layer 702 having an opening portion 706 is selectively formed over a substrate 701 that is a film-formation substrate, and a heat-insulating layer 703 is formed over the reflective layer 702. A light-absorbing layer 704 is selectively formed in a region not overlapping with the reflective layer 702, over the heat-insulating layer 703.

Figure 7B:
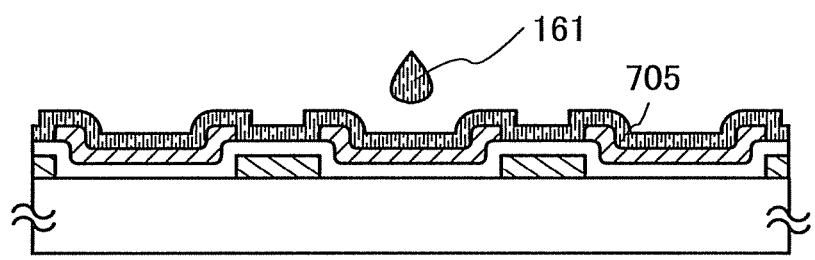

A material layer 705 is formed over the heat-insulating layer 703 and the light-absorbing layer 704, using a liquid composition 161 containing a deposition material by a wet process (FIG. 7B).

Figure 7C:
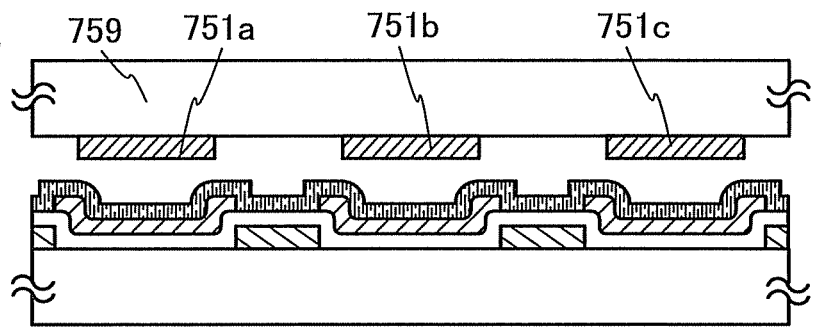

First electrode layers 751a, 751b, and 751c have been formed over an element substrate 759 that is the deposition substrate. The element substrate 759 and the substrate 701 are disposed such that the first electrode layers 751a, 751b, and 751c and the material layer 705 face each other (FIG. 7C).

Figure 7D:
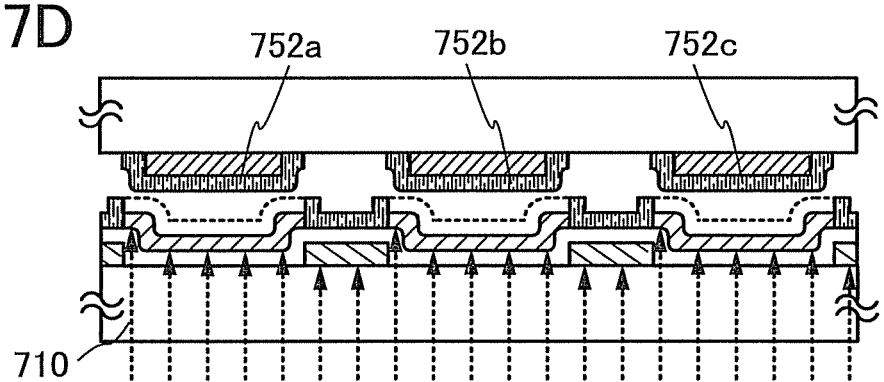

Irradiation with laser light 710 is conducted from the rear surface side of the substrate 701 (an opposite surface to the surface provided with the material layer 705) and at least part of the material contained in the material layer 705 is deposited due to heat given from the light-absorbing layer 704, on the element substrate 759 as EL layers 752a, 752b, and 752c (FIG. 7D). In the above-described process, the EL layers 752a, 752b, and 752c can be selectively formed on the first electrode layers 751a, 751b and 751c provided on the substrate 701 (FIG. 7E).

Figure 7E:
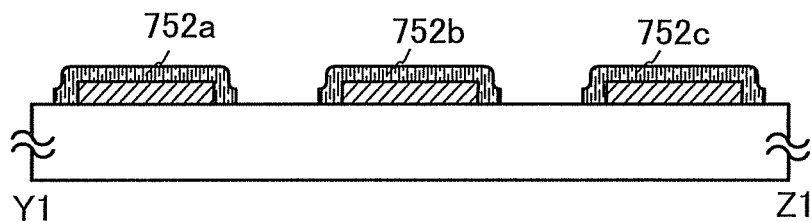

A second electrode layer 753b and an insulating layer 754 are formed over the EL layers 752a, 752b, and 752c in FIG. 7E, and sealing is conducted using a sealing substrate 758 to complete the light-emitting device illustrated in FIG. 5B.

The light-emitting device illustrated in FIGS. 5A and 5B is an example in which the sizes of the EL layers 752a, 752b, and 752c are larger than the widths (the widths in the direction of Y1-Z1) of the first electrode layers 751a, 751b, and 751c, and the EL layers 752a, 752b, and 752c cover end portions of the first electrode layers 751a, 751b, and 751c, respectively. This is because the width of the pattern of the light-absorbing layer which is selectively formed and is not overlapped with the reflective layer in FIGS. 7A to 7E is set to be larger than that of the pattern of the corresponding first electrode layer.

Figure 6A:
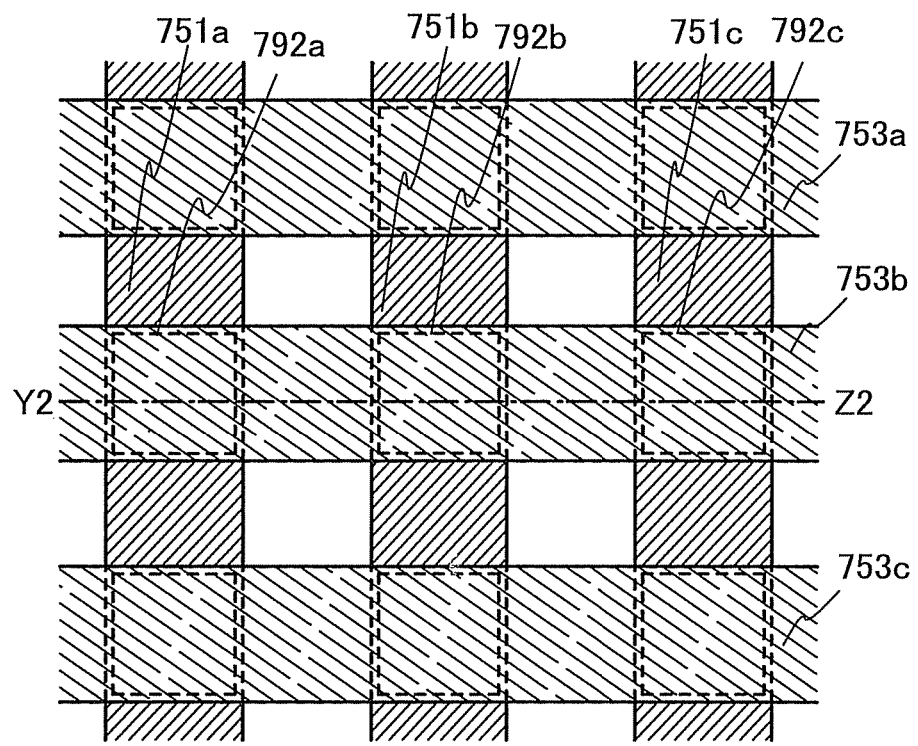
FIGS. 6A and 6B are a plan view and a cross-sectional view of a light-emitting device, respectively, according to an embodiment of the present invention.
Figure 6B:
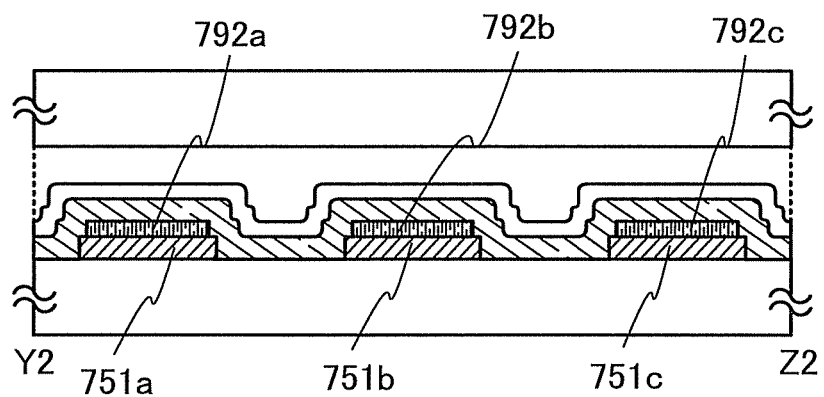

FIGS. 6A and 6B illustrate an example in which the whole area of an EL layer is formed over the first electrode. FIG. 6A is a plan view of the light-emitting device. FIG. 6B is a cross-sectional view taken along a line Y2-Z2 in FIG. 5A. In the light-emitting device illustrated in FIGS. 6A and 6B, the sizes of EL layers 792a, 792b, and 792c are smaller than those of the first electrode layers 751a, 751b, and 751c; thus, the whole areas of the EL layers 792a, 792b, and 792c are formed on the first electrode layers 751a, 751b, and 751c, respectively. By a film-formation method of the present invention, a film is deposited on a deposition substrate, reflecting a pattern of a material layer which is formed over the light-absorbing layer and which does not overlap with the reflective layer over the film-formation substrate. Thus, when the pattern of the material layer which is formed over the light-absorbing layer and which does not overlap with the reflective layer is set to be smaller than the first electrode layers 751a, 751b, and 751c, films can be deposited in shapes like those of the EL layers 792a, 792b, and 792c.

Further, in the passive matrix light-emitting device, a partition (an insulating layer) for separating the light-emitting elements may be provided. An example of a light-emitting device having a two-layer partition is illustrated in FIGS. 8A and 8B and FIGS. 9A to 9E.

Figure 8A:
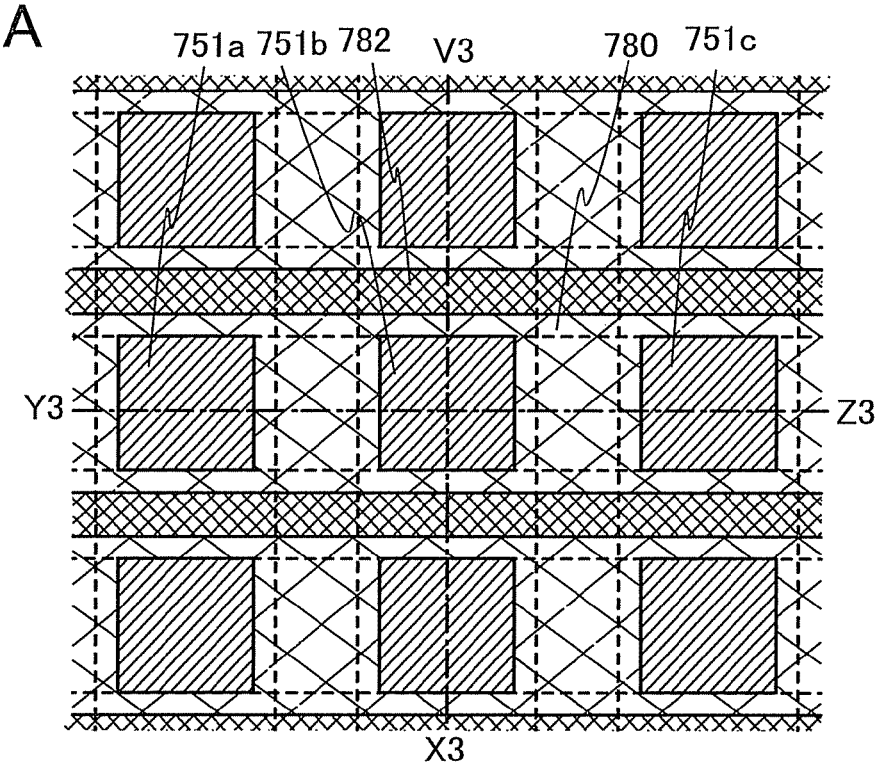
FIGS. 8A to 8C are a plan view and cross-sectional views of a light-emitting device according to an embodiment of the present invention.
Figure 8B:
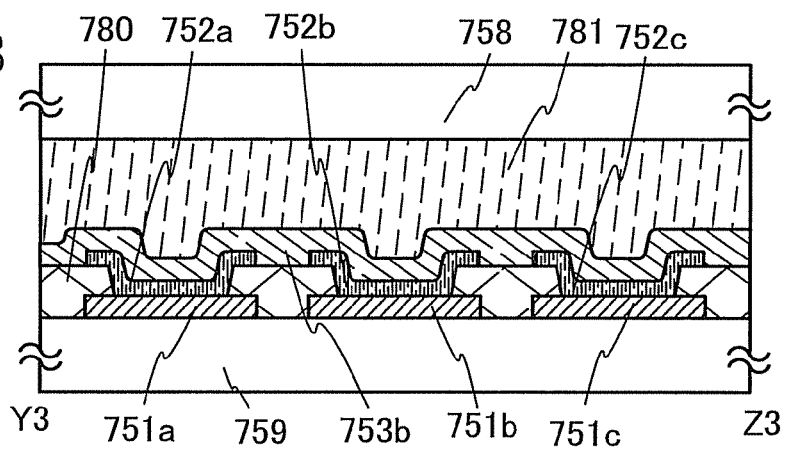
Figure 8C:
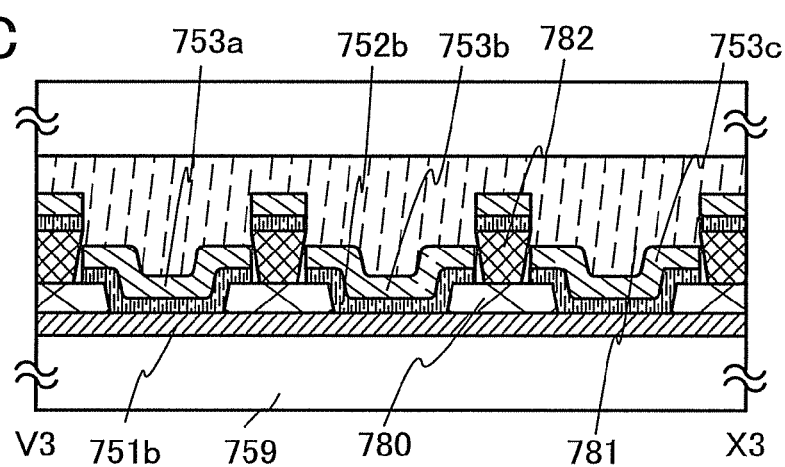

FIG. 8A is a plan view of the light-emitting device. FIG. 8B is a cross-sectional view taken along a line Y3-Z3 in FIG. 8A. FIG. 8C is a cross-sectional view taken along a line V3-X3 in FIG. 8A. Note that FIG. 8A is a plan view illustrating steps up to and including formation of a partition 782, and the EL layer and the second electrode layer are not illustrated.

As illustrated in FIGS. 8A to 8C, over the first electrode layers 751a, 751b, and 751c, a partition 780 is selectively formed to form opening portions in a pixel region. As illustrated in FIG. 8B, the partition 780 having a tapered shape is formed so as to cover end portions of the first electrode layers 751a, 751b, and 751c.

The partition 782 is selectively formed over the partition 780. The partition 782 has a function of intermittently separating the EL layer and the second electrode layer which are formed over the partition 782. The side faces of the partition 782 have inclination such that the distance between the opposite side faces is decreased toward an element substrate 759. That is, a cross section of the partition 782 in the direction of the short side is trapezoidal, where the bottom base (the side which is the same direction as the plane direction of the partition 780 and is in contact with the partition 780) is shorter than the top base (the side which is the same direction as the plane direction of the partition 780 and is not in contact with the partition 780). Since the partition 782 has a so-called inversely tapered shape, the EL layer 752b is separated by the partition 782 in a self alignment manner, and thus the EL layer 752b can be selectively formed on the first electrode layer 751b. Thus, adjacent light-emitting elements are separated without being processed by etching and an electrical defect such as short circuiting between the light-emitting elements can be prevented.

A method for manufacturing the light-emitting device of this embodiment illustrated in FIG. 8B, using a film-formation method of the present invention will be described with reference to FIGS. 9A to 9E.

Figure 9A:
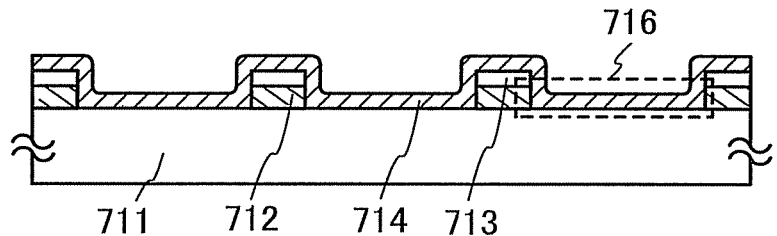
FIGS. 9A to 9E are cross-sectional views showing a manufacturing process of a light-emitting device according to an embodiment of the present invention.

FIG. 9A illustrates a structure similar to the film-formation substrate illustrated in FIG. 4A described in Embodiment 1. A reflective layer 712 having an opening portion 716 is selectively formed over a substrate 711 that is a film-formation substrate, and a heat-insulating layer 713 having the same pattern as the reflective layer 712 is selectively formed over the reflective layer 712. A light-absorbing layer 714 is formed over the substrate 711, the reflective layer 712, and the heat-insulating layer 713.

Figure 9B:
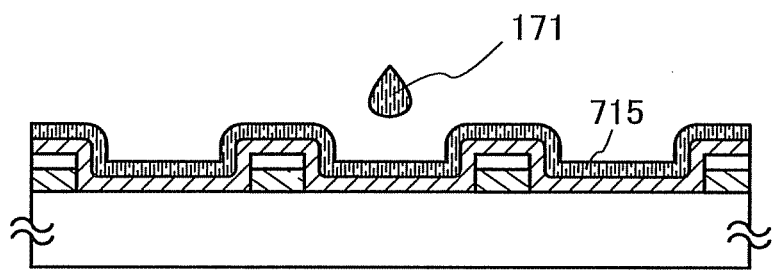

A material layer 715 is formed over the light-absorbing layer 714, using a liquid composition 171 containing a deposition material by a wet process (FIG. 9B).

Figure 9C:
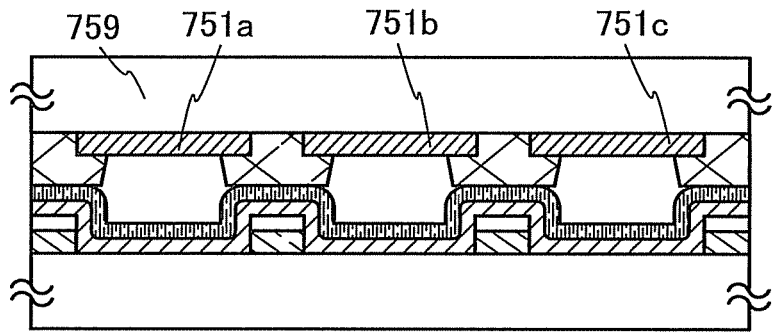

The first electrode layers 751a, 751b, and 751c and the partition 780 have been formed over the element substrate 759 that is the deposition substrate. The element substrate 759 and the substrate 711 are disposed such that the first electrode layers 751a, 751b, and 751c and the partition 780 face the material layer 715 (FIG. 9C).

Figure 9D:
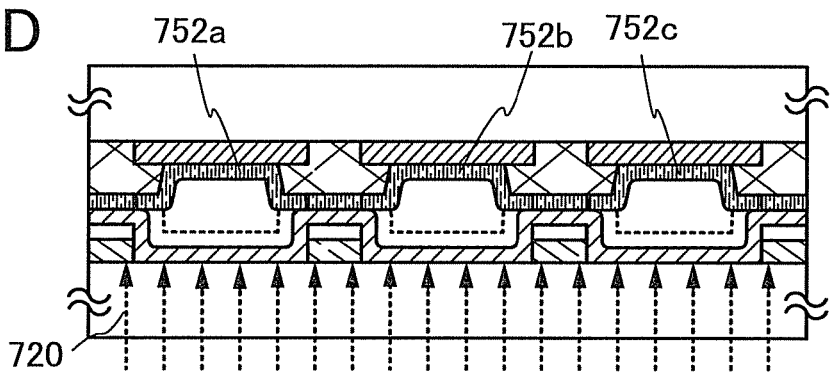

Irradiation with laser light 720 is conducted from the rear surface side of the substrate 711 (an opposite surface to the surface provided with the material layer 715) and at least part of the material contained in the material layer 715 is deposited due to heat given from the light-absorbing layer 714, on the element substrate 759 as EL layer 752a, the EL layer 752b, and EL layer 752c (FIG. 9D). In the above-described process, the EL layers 752a, 752b, and 752c can be selectively formed on the first electrode layers 751a, 751b and 751c provided on the element substrate 759 (FIG. 9E).

Figure 9E:
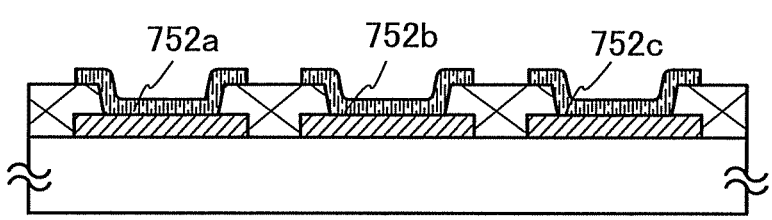

The second electrode layer 753b is formed over the EL layers 752a, 752b, and 752c illustrated in FIG. 9E, a filler layer 781 is formed, and sealing is performed using the sealing substrate 758, whereby the light-emitting device illustrated in FIG. 8B can be completed.

A glass substrate, a quartz substrate, or the like can be used as the sealing substrate 758. Alternatively, a flexible substrate may be used. The flexible substrate indicates a substrate that can be bent (flexible). For example, a high-molecular material elastomer, which can be processed to be shaped similarly to plastic by plasticization at high temperatures and has a property of an elastic body like rubber at room temperature, or the like can be used in addition to a plastic substrate made of polycarbonate, polyalylate, polyethersulfone, or the like. Alternatively, a film (made of polypropylene, polyester, vinyl, polyvinyl fluoride, vinyl chloride, or the like), an inorganic-deposited film, or the like can be used.

For the partition 780 and the partition 782, the following may be used: silicon oxide, silicon nitride, silicon oxynitride, aluminum oxide, aluminum nitride, aluminum oxynitride, another inorganic insulating material, acrylic acid, methacrylic acid, or a derivative thereof, a heat-resistant high-molecular material such as polyimide, aromatic polyamide, or polybenzimidazole, or a siloxane resin material. Alternatively, a resin material, e.g., a vinyl resin such as polyvinyl alcohol or polyvinylbutyral, an epoxy resin, a phenol resin, a novolac resin, an acrylic resin, a melamine resin, or a urethane resin may be used. As a formation method, a vapor deposition method such as a plasma CVD method or a thermal CVD method, or a sputtering method can be used. Alternatively, a droplet discharge method or a printing method can be used. A film obtained by an application method can also be used.

Figure 13:
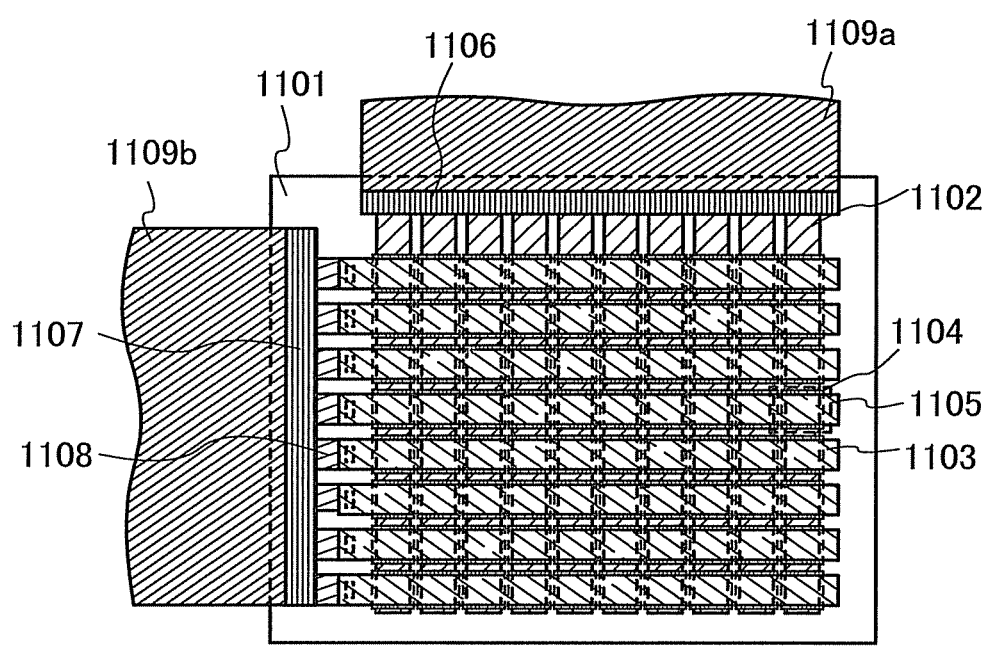
FIG. 13 is a plan view of a light-emitting display module according to an embodiment of the present invention.

Next, FIG. 13 illustrates a plan view of a case where the passive matrix light-emitting device illustrated in FIGS. 5A and 5B is provided with an FPC or the like.

In FIG. 13, scan lines and data lines perpendicularly intersect in a pixel portion for displaying images.

Here, the first electrode layers 751a, 751b, and 751c in FIGS. 5A and 5B correspond to data lines 1102 in FIG. 13; the second electrode layers 753a, 753b, and 753c in FIGS. 5A and 5B correspond to scan lines 1103 in FIG. 13; and the EL layers 752a, 752b, and 752c in FIGS. 5A and 5B correspond to EL layers 1104 in FIG. 13. The EL layer 1104 is interposed between the data line 1102 and the scan line 1103 over a substrate 1101, and an intersection portion indicated by a region 1105 corresponds to one pixel (indicated by the light-emitting element 750 in FIGS. 5A and 5B).

Note that terminals of the scan lines 1103 are electrically connected to connecting wirings 1108, and the connecting wirings 1108 are connected to an FPC 1109b via an input terminal 1107. The data lines 1102 are connected to an FPC 1109a via an input terminal 1106.

If necessary, an optical film such as a polarizing plate, a circularly polarizing plate (including an elliptically polarizing plate), a retardation plate (a quarter-wave plate or a half-wave plate), or a color filter may be provided as appropriate for an emission surface. Further, a polarizing plate or a circularly polarizing plate may be provided with an anti-reflection film. For example, anti-glare treatment can be performed, by which reflected light can be diffused by concave and convex portions of a surface, thereby reducing reflection.

Although FIG. 13 illustrates the example in which a driver circuit is not provided over the substrate, the present invention is not particularly limited to this example. An IC chip including a driver circuit may be mounted on the substrate.

In the case where an IC chip is mounted, a data line side IC and a scan line side IC, each of which is provided with a driver circuit for transmitting signals to the pixel portion, are mounted on the periphery (outside) of the pixel portion by a chip on glass (COG) method. The mounting may be performed using TCP or a wire bonding method other than the COG method. TCP is a method in which an IC is mounted onto a tape automated bonding (TAB) tape, where the TAB tape is connected to a wiring on an element formation substrate to mount the IC. Each of the data line side IC and the scan line side IC may be formed using a single crystal silicon substrate, or may be formed with a driver circuit with TFTs formed over a glass substrate, a quartz substrate, or a plastic substrate. Although described here is an example in which a single IC is provided on one side, a plurality of divided ICs may be provided on one side.

According to the present invention, a minute pattern thin film can be formed on a deposition substrate without providing a mask between the material and the deposition substrate. As in this embodiment, a light-emitting element can be formed by such a film-formation method and thus a high-definition light-emitting device can be manufactured.

This embodiment can be combined with any of Embodiments 1 to 4 as appropriate.

Embodiment 6

In Embodiment 6, an active matrix light-emitting device manufactured according to the present invention will be described with reference to FIGS. 14A and 14B.

Figure 14A:
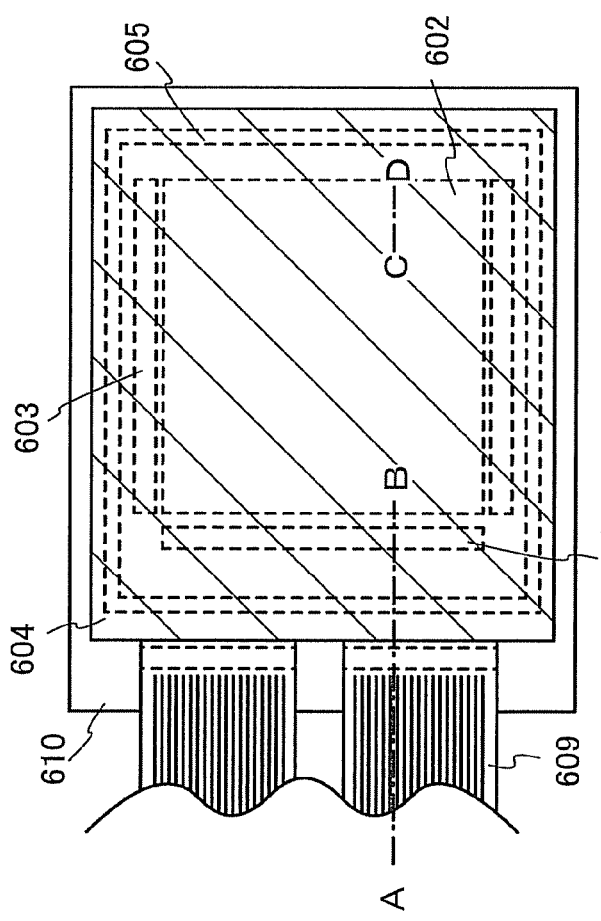
FIGS. 14A and 14B are a plan view and a cross-sectional view, respectively, of a light-emitting display module according to an embodiment of the present invention.
Figure 14B:
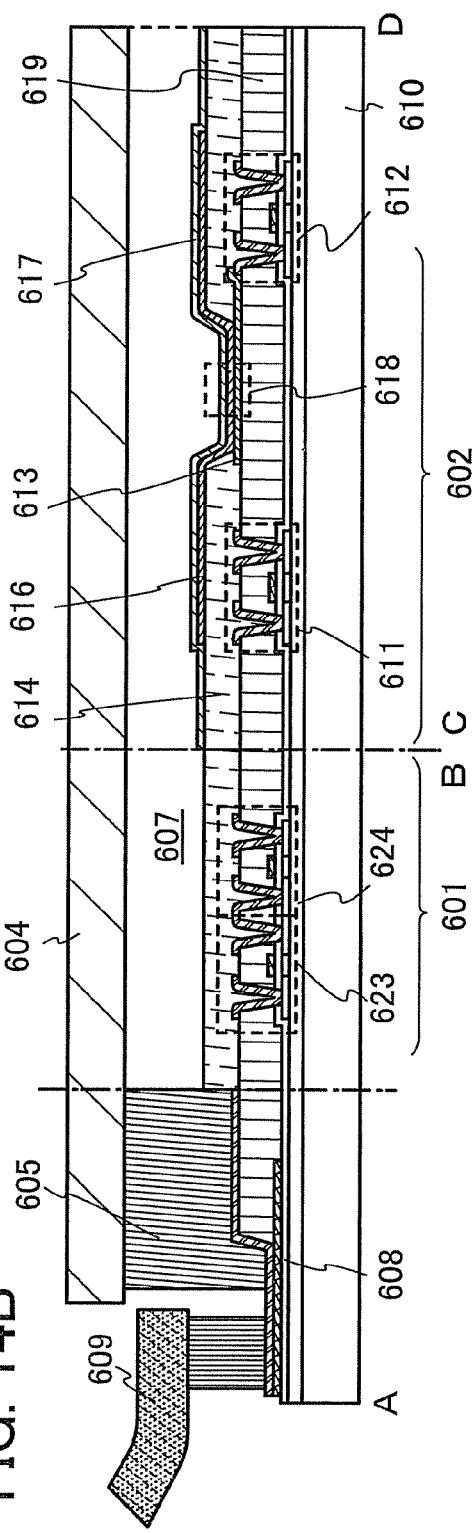

FIG. 14A is a plane view of a light-emitting device. FIG. 14B is a cross-sectional view taken along lines A-B and C-D in FIG. 14A. Reference numerals 601, 602, and 603 denote a driver circuit portion (a source side driver circuit), a pixel portion, and a driver circuit portion (a gate side driver circuit), respectively, which are indicated by dotted lines. In addition, reference numerals 604 and 605 denote a sealing substrate and a sealing material, respectively. A portion surrounded by the sealing material 605 corresponds to a space 607.

A lead wiring 608 is a wiring for transmitting signals to the source side driver circuit 601 and the gate side driver circuit 603, and the wiring 608 receives video signals, clock signals, start signals, reset signals, or the like from an flexible printed circuit (FPC) 609 which serves as an external input terminal. Although only the FPC is illustrated here, the FPC may be provided with a printed wiring board (PWB). The light-emitting device in this specification includes not only a light-emitting device itself but also a light-emitting device with an FPC or a PWB attached thereto.

Next, a cross-sectional structure will be described with reference to FIG. 14B. The driver circuit portion and the pixel portion are formed over an element substrate 610. Here, the source driver circuit 601, which is the driver circuit portion, and one pixel in the pixel portion 602 are illustrated.

A CMOS circuit, which is a combination of an n-channel transistor 623 and a p-channel transistor 624, is formed for the source side driver circuit 601. The driver circuit may be formed using a variety of types of circuits, such as a CMOS circuit, a PMOS circuit, or an NMOS circuit. Although a driver-integration type device, in which a driver circuit is formed over the substrate, is illustrated in this embodiment, a driver circuit is not necessarily formed over the same substrate as the pixel portion and can be formed outside the substrate.

The pixel portion 602 has a plurality of pixels, each of which includes a switching transistor 611, a current-controlling transistor 612, and a first electrode 613, which is electrically connected to a drain of the current-controlling transistor 612. Note that an insulating layer 614 is formed so as to cover an end portion of the first electrode 613. Here, a positive photosensitive acrylic resin film is used for the insulating layer 614. The first electrode 613 is formed over an insulating layer 619 which is an interlayer insulating layer.

The insulating layer 614 is formed so as to have a curved surface having curvature at an upper end portion or a lower end portion thereof for the purpose of favorable coverage. For example, in the case of using a positive photosensitive acrylic resin as material for the insulating layer 614, the insulating layer 614 is preferably formed so as to have a curved surface with a curvature radius (0.2 μm to 3 μm) only at the upper end portion of the insulating layer 614. Either a negative photoresist which becomes insoluble in an etchant by light irradiation or a positive photoresist which becomes soluble in an etchant by light irradiation can be used for the insulating layer 614.

Note that the structure of the transistor is not particularly limited. The transistor may have a single-gate structure in which one channel formation region is formed, a double-gate structure in which two channel formation regions are formed, or a triple-gate structure in which three channel formation regions are formed. In addition, transistors in the peripheral driver circuit region may also have a single-gate structure, a double-gate structure, or a triple-gate structure.

The transistor can be employed in a top-gate structure (such as a staggered structure or a coplanar structure), a bottom-gate structure (such as an inverted coplanar structure), a dual-gate structure including two gate electrode layers provided above and below a channel region with a gate insulating film interposed therebetween, or other structures.

Further, the crystallinity of a semiconductor used for forming the transistor is not particularly limited. The semiconductor layer can be formed using an amorphous semiconductor manufactured by a vapor deposition method using a semiconductor material gas typified by silane or germane or a sputtering method, a polycrystalline semiconductor formed by crystallization of the amorphous semiconductor by utilization of light energy or thermal energy, a single crystal semiconductor, or the like.

Typical examples of an amorphous semiconductor include hydrogenated amorphous silicon, and typical examples of a crystalline semiconductor include polysilicon and the like. Examples of polysilicon (polycrystalline silicon) include so-called high-temperature polysilicon which contains polysilicon as a main component and is formed at a process temperature of 800° C. or higher, so-called low-temperature polysilicon which contains polysilicon as a main component and is formed at a process temperature of 600° C. or lower, polysilicon obtained by crystallization of amorphous silicon by use of an element which promotes crystallization or the like. Instead of such a thin film formation process, an SOI substrate formed by provision of a single crystalline semiconductor layer on an insulating surface may be used. The SOI substrate can be formed by an SIMOX (separation by implanted oxygen) method or a Smart-Cut (registered mark) method. In the SIMOX method, oxygen ions are implanted into a single crystalline silicon substrate to form an oxygen-containing layer at a predetermined depth, and then heat treatment is performed to form an embedded insulating layer at a predetermined depth from the surface, thereby forming a single crystal silicon layer on the embedded insulating layer. In the Smart-Cut method, hydrogen ions are implanted into an oxidized single crystal silicon substrate to form a hydrogen-containing layer in a portion corresponding to a desired depth, the oxidized single crystal silicon substrate is attached to a support substrate (such as a single crystalline silicon substrate having a silicon oxide film for attachment on its surface), and heat treatment is performed. Accordingly, the single crystal silicon substrate is separated at the hydrogen-containing layer, and a stacked layer of the silicon oxide film and the single crystalline silicon layer is formed on the support substrate.

An EL layer 616 and a second electrode 617 are formed over the first electrode 613. The EL layer 616 of a light-emitting element described in this embodiment can be formed by application of the film-formation method described in Embodiment 1.

The sealing substrate 604 and the element substrate 610 are attached to each other with the sealing material 605, whereby the light-emitting element 618 is provided in the space 607 surrounded by the element substrate 610, the sealing substrate 604, and the sealing material 605. Note that the space 607 is filled with a filler. Alternatively, the space 607 is filled with an inert gas (e.g., nitrogen or argon) or the sealing material 605.

As the sealing material 605, a visible light curable resin, a UV curable resin, or a thermosetting resin is preferably used. Specifically, an epoxy resin can be used. It is desirable that the material allows as little moisture or oxygen as possible to penetrate. As the sealing substrate 604, a plastic substrate formed of FRP (fiberglass-reinforced plastics), PVF (polyvinyl fluoride), polyester, acrylic, or the like can be used besides a glass substrate or a quartz substrate. Alternatively, a film (made of polypropylene, polyester, vinyl, polyvinyl fluoride, vinyl chloride, or the like), an inorganic-deposited film, or the like can be used.

Further, an insulating layer may be provided as a passivation film (a protective film) over the light-emitting element. The passivation film can be formed as a single layer or a stacked layer of an insulating film(s) containing silicon nitride, silicon oxide, silicon oxynitride, silicon nitride oxide, aluminum nitride, aluminum oxynitride, aluminum nitride oxide in which the amount of nitrogen is higher than that of oxygen, aluminum oxide, diamond-like carbon (DLC), or nitrogen-containing carbon. Alternatively, a siloxane resin may be used.

The space 607 may be filled with nitrogen or the like by being sealed in a nitrogen atmosphere, instead of the filler. In the case where light is extracted from the light-emitting device through the filler, the filler should have a light-transmitting property. For example, a visible light curable epoxy resin, a UV curable epoxy resin, or a thermosetting epoxy resin may be used for the filler. The filler may be dropped in a liquid state to fill the inside of the light-emitting device. When a hygroscopic substance such as a drying agent is used as the filler, or the filler is doped with a hygroscopic substance, a higher water absorbing effect can be achieved and deterioration of an element can be prevented.

In addition, with use of a retardation film and/or a polarizing plate, reflected light of light incident from outside may be blocked. An insulating layer serving as a partition may be colored to be used as a black matrix. This partition can be formed by a droplet discharge method. Carbon black or the like may be mixed into a resin material such as polyimide, and a stack thereof may be used. By a droplet discharge method, different materials may be discharged to the same region plural times to form the partition. A quarter wave plate and/or a half wave plate may be used as the retardation plate and may be designed to control light. As the structure, the element substrate, the light-emitting element, the sealing substrate (the sealing material), the retardation plate (a quarter wave plate ($\lambda/4$) and/or a half wave plate ($\lambda/2$)), and the polarizing plate are sequentially formed, and light emitted from the light-emitting element is transmitted therethrough and is emitted to the outside through the polarizing plate. The retardation films and the polarizing plate may be provided on a side through which light is transmitted, or may be provided on both sides in the case of a dual emission light-emitting device in which light is emitted from the both sides. In addition, an anti-reflective film may be provided on the outer side of the polarizing plate. Accordingly, an image with higher resolution and precision can be displayed.

Although the circuit described above is used in this embodiment, the present invention is not limited thereto. An IC chip may be mounted by the above-described COG method or TAB method as a peripheral driver circuit. The number of a gate line driver circuit or a source line driver circuit may be single or plural.

In the light-emitting device of the present invention, a driving method for image display is not particularly limited. For example, a dot sequential driving method, a line sequential driving method, an area sequential driving method, or the like may be used. Typically, a line sequential driving method may be used, and a time division gray scale driving method and an area gray scale driving method may be used as appropriate. Further, a video signal input to the source line of the light-emitting device may be an analog signal or a digital signal. The driver circuit and the like may be designed as appropriate in accordance with the video signal.

For color display, a light-emitting layer having a different light emission wavelength range may be formed in each pixel. Typically, light-emitting layers corresponding to colors of R (red), G (green), and B (blue) are formed. Also in this case, color purity can be improved and a pixel region can be prevented from having a mirror surface (reflection), by provision of a filter which transmits light of the emission wavelength range on the light-emission side of the pixel. By provision of the filter, the loss of light emitted from the light-emitting layer can be eliminated. Furthermore, change in color tone, which occurs when a pixel region (a display screen) is obliquely seen, can be reduced.

According to the present invention, a minute pattern thin film can be formed on a deposition substrate without providing a mask between a material and the deposition substrate. As in this embodiment, a light-emitting element can be formed by such a film-formation method and a high-definition light-emitting device can be manufactured.

This embodiment can be combined with any of Embodiments 1 to 4 as appropriate.

Embodiment 7

By application of the present invention, a variety of light-emitting devices having a display function can be manufactured. That is, the present invention can be applied to a variety of electronic devices in which light-emitting devices having a display function are incorporated into display portions.

As such electronic devices of the present invention, the following can be given: television devices (also simply referred to as televisions or television receivers), cameras such as digital cameras or digital video cameras, mobile phone devices (also simply referred to as mobile phones or cellular phones), portable information terminals such as PDAs, portable game machines, monitors for computers, computers, audio reproducing devices such as car audio systems, image reproducing devices provided with a recording medium such as home game machines (specifically, a digital versatile disc (DVD)), and the like. Further, the present invention can be applied to any kinds of game consoles or game machines having a display device, such as pachinko machines, slot machines, pinball machines, and large game machines. Specific examples thereof will be described with reference to FIGS. 15A to 15F, FIGS. 16A and 16B, and FIGS. 17A to 17C.

The applicable range of the light-emitting device of the present invention is so wide that the light-emitting device can be applied to electronic devices in a wide variety of fields. Since a film-formation method of the present invention, which has been described in Embodiment 1, is used, electronic devices with high image quality having a large display portion or lighting portion can be provided.

Figure 15A:
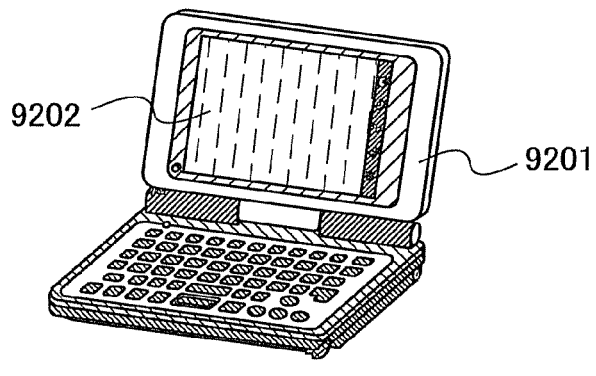
FIGS. 15A to 15F illustrate electronic devices according to an embodiment of the present invention.

A portable information terminal device illustrated in FIG. 15A includes a main body 9201, a display portion 9202, and the like. A light-emitting device of the present invention can be applied to the display portion 9202. As a result, a portable information terminal device with high image quality can be provided.

Figure 15B:
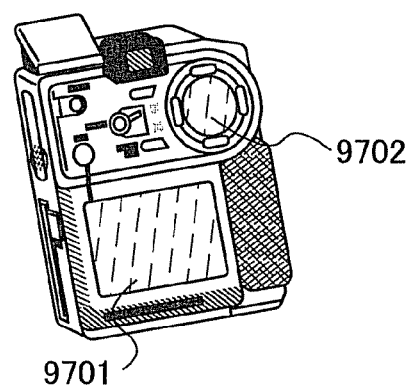

A digital video camera illustrated in FIG. 15B includes a display portion 9701, a display portion 9702, and the like. A light-emitting device of the present invention can be applied to the display portion 9701. As a result, a digital video camera with high image quality can be provided.

Figure 15C:
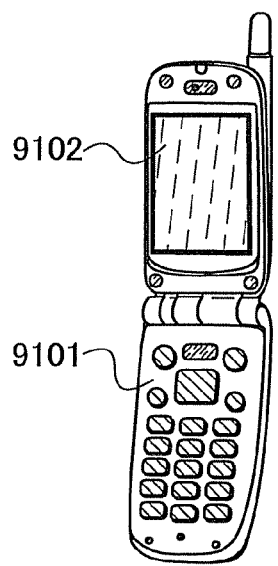

A mobile phone device illustrated in FIG. 15C includes a main body 9101, a display portion 9102, and the like. A light-emitting device of the present invention can be applied to the display portion 9102. As a result, a mobile phone device with high image quality can be provided.

Figure 17A:
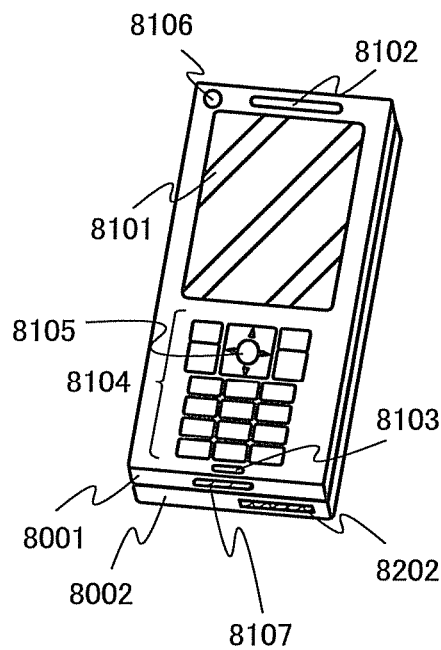
FIGS. 17A to 17C illustrate an electronic device according to an embodiment of the present invention.
Figure 17B:
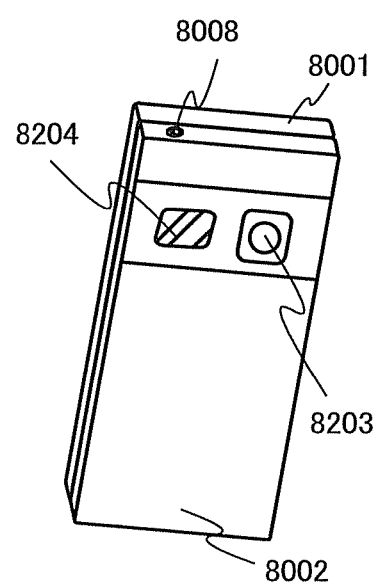
Figure 17C:
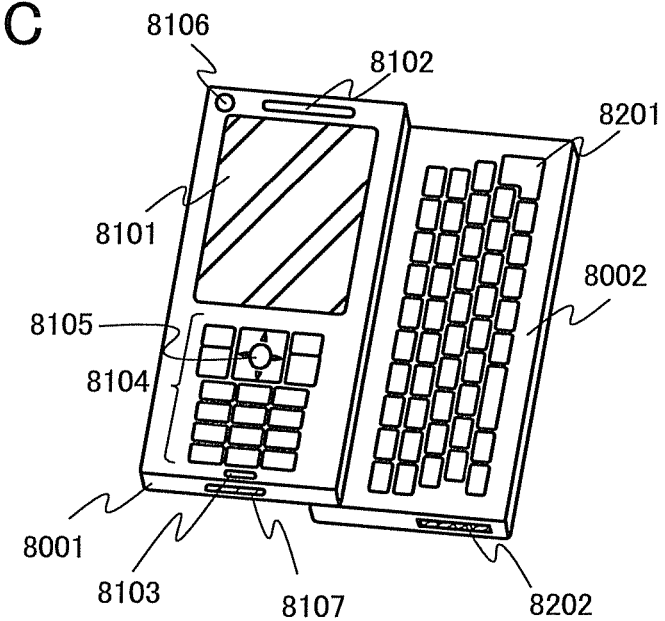

FIGS. 17A to 17C illustrate an example of a mobile phone device, which is different from the mobile phone device illustrated in FIG. 15C. FIG. 17A is a front view, FIG. 17B is a rear view, and FIG. 17C is a development view. The mobile phone device has both a function of a mobile phone and a function of a portable information terminal, and incorporates a computer provided to conduct a variety of data processing in addition to verbal communication (voice calls); therefore, it is called smartphone.

The smartphone has two housings 8001 and 8002. The housing 8001 includes a display portion 8101, a speaker 8102, a microphone 8103, operation keys 8104, a pointing device 8105, a front camera lens 8106, an external connection terminal 8107, and the like, while the housing 8002 includes a keyboard 8201, an external memory slot 8202, a rear camera lens 8203, a light 8204, an earphone terminal 8008 and the like. In addition, an antenna is incorporated in the housing 8001.

Further, in addition to the above structure, the smartphone may incorporate a non-contact IC chip, a small size memory device, or the like.

In the display portion 8101, the light-emitting device described in the above embodiment can be incorporated, and display direction can be changed depending on a use mode. Because the front camera lens 8106 is provided in the same plane as the display portion 8101, the smartphone can be used as a videophone. A still image and a moving image can be taken by the rear camera lens 8203 and the light 8204 by using the display portion 8101 as a viewfinder. The speaker 8102 and the microphone 8103 can be used for uses of videophone, recording, playback and the like without being limited to verbal communication. With use of the operation keys 8104, operation of incoming and outgoing calls, simple information input of electronic mail or the like, scrolling of a screen, cursor motion and the like are possible. Further, when the housing 8001 and housing 8002 which are put together (FIG. 17A) are slid out as illustrated in FIG. 17C, and used as a portable information terminal, smooth operation can be conducted by using the keyboard 8201 or the pointing device 8105. The external connection terminal 8107 can be connected to an AC adaptor and various types of cables such as a USB cable, and charging and data communication with a personal computer or the like are possible. Moreover, a large amount of data can be stored by putting a storage medium into the external memory slot 8202 and can be moved.

Further, the smartphone may include an infrared communication function, a function of a television receiver or the like, in addition to the above-described functions.

Since a light-emitting device of the present invention can be applied to the display portion 8101, a mobile phone device with high image quality can be provided.

Figure 15D:
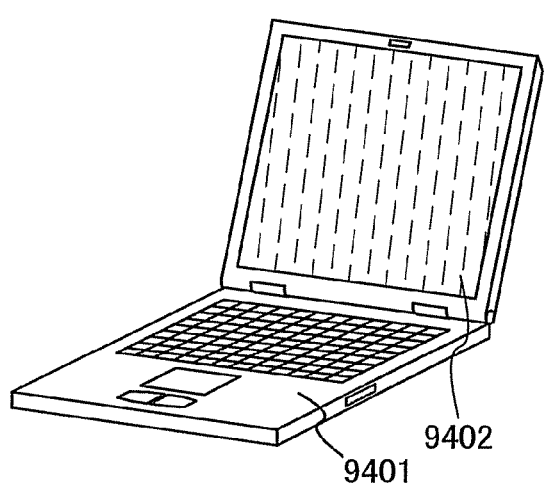

A portable computer illustrated in FIG. 15D includes a main body 9401, a display portion 9402, and the like. A light-emitting device of the present invention can be applied to the display portion 9402. As a result, a portable computer with high image quality can be provided.

Figure 15E:
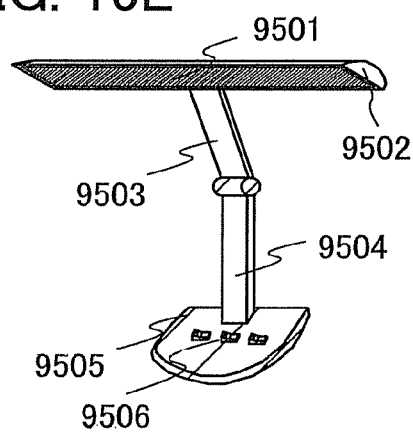

A light-emitting device to which the present invention is applied can also be used as a small desk lamp or a large room lighting device. FIG. 15E illustrates a desk lamp including a lighting portion 9501, a shade 9502, an adjustable arm 9503, a support 9504, a base 9505, and a power supply 9506. The desk lamp is manufactured using a light-emitting device of the present invention for the lighting portion 9501. Note that a lamp includes a ceiling light, a wall light, and the like in its category. The present invention enables large lighting equipment to be provided.

Furthermore, a light-emitting device of the present invention can also be used as a backlight of a liquid crystal display device. The light-emitting device of the present invention is a plane-emission light-emitting device and can be formed to have a large area; thus, a larger-area backlight can be obtained and a larger-area liquid crystal display device can also be obtained. Further, since the light-emitting display device of the present invention is thin, a liquid crystal display device can also be made thin.

Figure 15F:
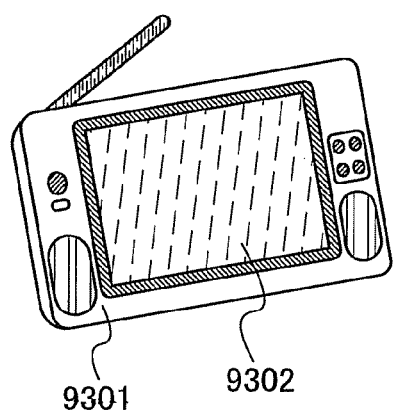

A portable television device illustrated in FIG. 15F includes a main body 9301, a display portion 9302, and the like. A light-emitting device of the present invention can be applied to the display portion 9302. As a result, a portable television device with high image quality can be provided. The light-emitting device of the present invention can be widely applied to a variety of television sets such as a small size one incorporated in a portable terminal such as a mobile phone device, a medium size one that is portable, and a large size one (e.g., 40 inches or more).

Figure 16A:
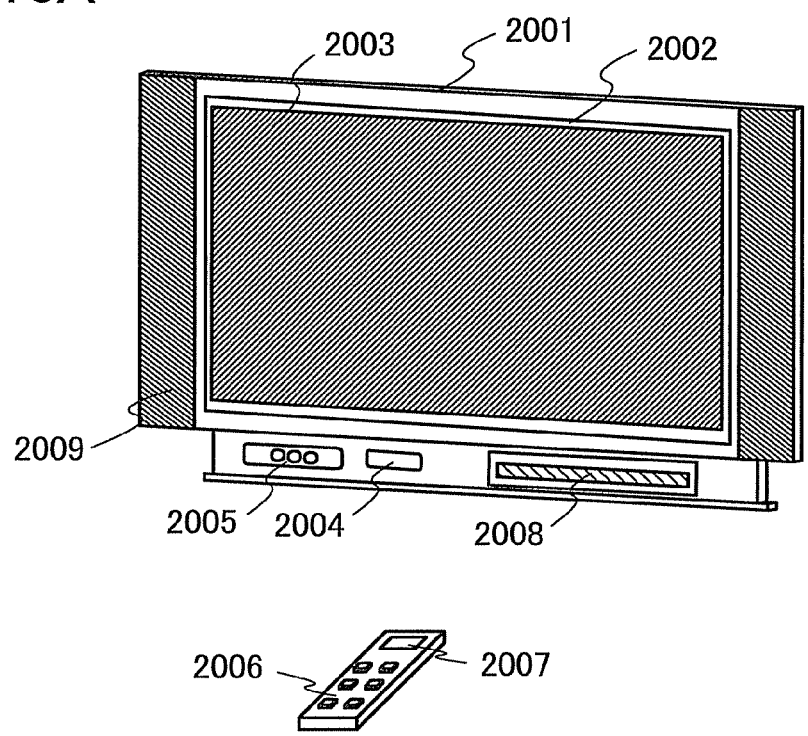
FIGS. 16A and 16B illustrate electronic devices according to an embodiment of the present invention.

FIG. 16A illustrates a television device having a large display portion. A main screen 2003 is formed using the light-emitting device of the present invention, and a speaker portion 2009, an operation switch, and the like are provided as its accessory equipment. In this manner, the television device can be completed.

As illustrated in FIG. 16A, a display panel 2002 using a light-emitting element is incorporated into a housing 2001. The television device can receive general TV broadcast by a receiver 2005, and can be connected to a wired or wireless communication network via a modem 2004 so that one-way (from a sender to a receiver) or two-way (between a sender and a receiver or between receivers) information communication can be performed. The television device can be operated with a switch incorporated into the housing or a separate remote control unit 2006. The remote control unit may include a display portion 2007 for displaying information to be output.

Further, the television device may also include a sub screen 2008 formed using a second display panel so as to display channels, volume, and the like, in addition to the main screen 2003.

Figure 16B:
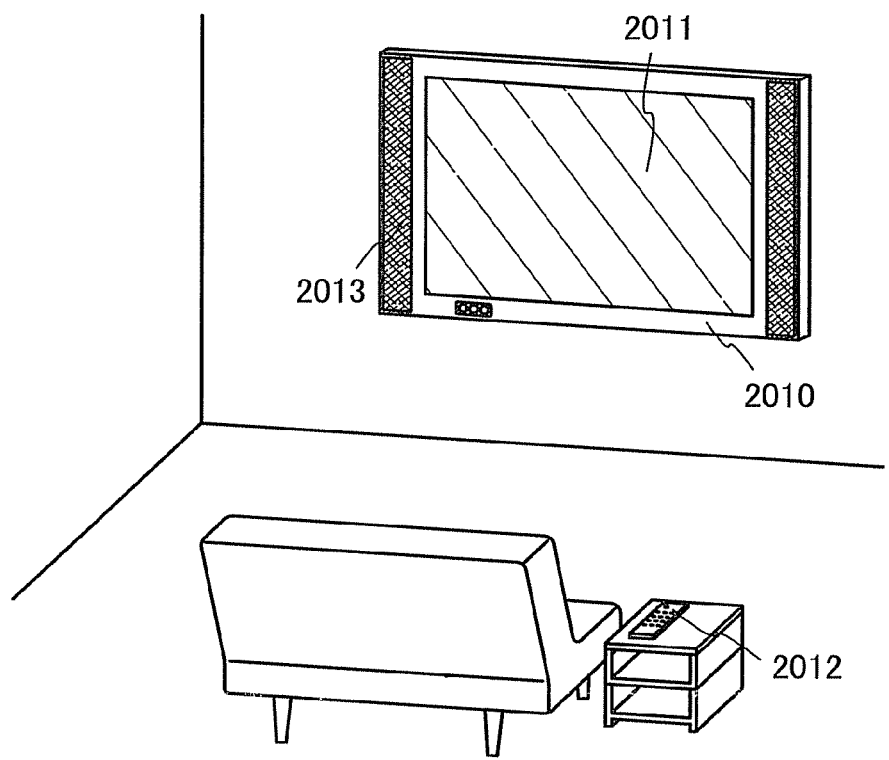

FIG. 16B illustrates a television device having a large display portion, for example, a 20-inch to 80-inch display portion. The television device includes a housing 2010, a display portion 2011, a remote control device 2012 which is an operation portion, a speaker portion 2013, and the like. The present invention is applied to the display portion 2011. By application of the present invention, a television device which is large and has high image quality can be provided. In addition, since the television device illustrated in FIG. 16B is a wall-hanging type, it does not occupy an installation space.

Needless to say, the present invention can be applied to a wide variety of applications such as a large-area display media like information display boards at railway stations, airports, and the like or street-side advertisement display boards.

This embodiment can be combined with any of Embodiments 1 to 6 as appropriate.

This application is based on Japanese Patent Application serial no. 2008-049971 filed with Japan Patent Office on Feb. 29, 2008, the entire contents of which are hereby incorporated by reference.

What is claimed is:

1. A film-formation method comprising:
forming a reflective layer on a first substrate, and the reflective layer having an opening portion;
forming a first heat-insulating layer having a light-transmitting property over the reflective layer and the opening portion;
forming a light-absorbing layer over the first heat-insulating layer;
forming a second heat-insulating layer over the light-absorbing layer, the second heat-insulating layer having been selectively formed to be essentially only overlapping with the reflective layer;
forming a material layer using a liquid composition containing a material over the light-absorbing layer and the second heat-insulating layer by a wet process;
performing a heat treatment to the material layer so as to remove a solvent in the liquid composition;
disposing the first substrate and a second substrate such that the material layer is interposed therebetween; and
after performing the heat treatment, irradiating at least a part of the light-absorbing layer with laser light through the first substrate, the opening portion of the reflective layer, and the first heat-insulating layer; whereby the material, contained in the material layer formed over the part of the light-absorbing layer, deposits on the second substrate,
wherein a thickness of the second heat-insulating layer is larger than a thickness of the first heat-insulating layer,
wherein a difference between a reflectance with respect to the laser light of the reflective layer and that of the light-absorbing layer is more than 25%, and
wherein the laser light has a repetition rate of 10 MHz or higher and a pulse width of from 100 fs to 10 ns.

2. The film-formation method according to claim 1, wherein the second substrate is disposed above the first substrate with the material layer interposed therebetween.

3. The film-formation method according to claim 1, wherein the step of irradiating the part of the light-absorbing layer with the laser light is conducted under a pressure of $5 \times 10^{-3}$ Pa or less.

4. The film-formation method according to claim 1, wherein the wet process is an application method selected from the group consisting of a spin coating method, and an inkjet method.

5. The film-formation method according to claim 1, wherein the liquid composition contains an organic compound.

6. The film-formation method according to claim 1, wherein the laser light has a beam spot on the first substrate having a linear shape.

7. The film-formation method according to claim 1, wherein the material is in contact with the second substrate before the irradiating step.

8. A method for manufacturing a light-emitting device, comprising:
forming a reflective layer on a first substrate, and the reflective layer having an opening portion;
forming a first heat-insulating layer having a light-transmitting property over the reflective layer and the opening portion;
forming a light-absorbing layer over the first heat-insulating layer;
forming a second heat-insulating layer over the light-absorbing layer, the second heat-insulating layer having been selectively formed to be essentially only overlapping with the reflective layer;
forming a material layer using a liquid composition containing a material over the light-absorbing layer and the second heat-insulating layer by a wet process;
performing a heat treatment to the material layer so as to remove a solvent in the liquid composition;
forming a first electrode over a second substrate;
disposing the first substrate and the second substrate such that the material layer faces the first electrode; and
after performing the heat treatment, irradiating at least a part of the light-absorbing layer with laser light through the first substrate, the opening portion of the reflective layer, and the first heat-insulating layer; whereby the material, contained in the material layer formed over the part of the light-absorbing layer, deposits on the first electrode,
forming a second electrode over the material deposited on the first electrode,
wherein a thickness of the second heat-insulating layer is larger than a thickness of the first heat-insulating layer,
wherein a difference between a reflectance with respect to the laser light of the reflective layer and that of the light-absorbing layer is more than 25%, and
wherein the laser light has a repetition rate of 10 MHz or higher and a pulse width of from 100 fs to 10 ns.

9. The method for manufacturing a light-emitting device, according to claim 8, wherein the second substrate is disposed above the first substrate with the material layer interposed therebetween.

10. The method for manufacturing a light-emitting device, according to claim 8, wherein the step of irradiating the part of the light-absorbing layer with the laser light is conducted under a pressure of $5 \times 10^{-3}$ Pa or less.

11. The method for manufacturing a light-emitting device, according to claim 8, wherein the wet process is an application method selected from the group consisting of a spin coating method and an inkjet method.

12. The method for manufacturing a light-emitting device, according to claim 8, wherein the liquid composition contains an organic compound.

13. The method for manufacturing a light-emitting device, according to claim 8, wherein the laser light has a beam spot on the first substrate having a linear shape.

14. The method for manufacturing a light-emitting device, according to claim 8, wherein the material is in contact with the second substrate before the irradiating step.

* * * * *

UNITED STATES PATENT AND TRADEMARK OFFICE
CERTIFICATE OF CORRECTION

Page 1 of 1

PATENT NO. : 8,734,915 B2
APPLICATION NO. : 12/391840
DATED : May 27, 2014
INVENTOR(S) : Shunpei Yamazaki et al.

It is certified that error appears in the above-identified patent and that said Letters Patent is hereby corrected as shown below:

In the Specification:

Column 6, Line 20; Change "100 μm to 600 μm." to --100 nm to 600 nm.--.

Column 6, Lines 20 to 21; Change "from 10 μm to 2 μm," to --from 10 nm to 2 μm,--.

Column 9, Line 26; Change "355 μm," to --355 nm,--.

Column 15, Line 24; Change "FIG. 1A," to --FIG. 11A,--.

Column 17, Line 60; Change "CZPA)" to --CzPA)--.

Column 18, Line 60; Change "[4,5-a]" to --[4,5-α]--.

Column 19, Line 37; Change "CZPA)." to --CzPA).--.

Column 21, Line 43; Change "CZPA)," to --CzPA),--.

Column 26, Line 24; Change "polyalylate," to --polyarylate,--.

Column 28, Line 17; Change "as material" to --as a material--.

Signed and Sealed this
Fourteenth Day of October, 2014

Michelle K. Lee
*Deputy Director of the United States Patent and Trademark Office*